(12) United States Patent
Kong

(10) Patent No.: US 10,824,281 B2
(45) Date of Patent: Nov. 3, 2020

(54) SENSOR DEVICE AND METHOD

(71) Applicant: Tangi0 Limited, London (GB)

(72) Inventor: Ming Kong, London (GB)

(73) Assignee: Tangi0 Limited, London (GB)

( * ) Notice: Subject to any disclaimer, the term of this patent is extended or adjusted under 35 U.S.C. 154(b) by 0 days.

(21) Appl. No.: 15/735,671

(22) PCT Filed: Jun. 23, 2016

(86) PCT No.: PCT/EP2016/025067
§ 371 (c)(1),
(2) Date: Dec. 12, 2017

(87) PCT Pub. No.: WO2016/206819
PCT Pub. Date: Dec. 29, 2016

(65) Prior Publication Data
US 2018/0364832 A1 Dec. 20, 2018

(30) Foreign Application Priority Data

Jun. 23, 2015 (GB) .................................. 1511042.2

(51) Int. Cl.
*G06F 3/044* (2006.01)
*G06F 3/0362* (2013.01)
(Continued)

(52) U.S. Cl.
CPC ............ *G06F 3/044* (2013.01); *G06F 3/0362* (2013.01); *G06F 3/03547* (2013.01);
(Continued)

(58) Field of Classification Search
CPC ........... G05B 2219/40553; G06F 3/016; G06F 3/04886; B60W 50/16; F15B 13/14; H01H 13/85
See application file for complete search history.

(56) References Cited

U.S. PATENT DOCUMENTS

| | | |
|---|---|---|
| 5,510,812 A | 4/1996 | O'Mara et al. |
| 8,803,844 B1 | 8/2014 | Green et al. |

(Continued)

FOREIGN PATENT DOCUMENTS

DE 19750671 6/1998

OTHER PUBLICATIONS

Smith et al., Tech Note: Digital Foam, Wearable Computer Laboratory, University of Southern Australia, IEEE Symposium on 3-D User Interfaces. Mar. 8-9, 2008, Reno, Nevada, 978-1-4244-2047-5/08.

(Continued)

*Primary Examiner* — William Lu
(74) *Attorney, Agent, or Firm* — Andrus Intellectual Property Law, LLP

(57) ABSTRACT

A sensor device is provided for generating an electrical signal. The device includes an electrically conductive material having, at least in part, a three-dimensionally profiled surface. The surface is configured to create a change in said electrical signal in response to movement of a conductive object (e.g. a person's finger) thereacross. A method of using the sensor device includes connecting the sensor device to an electrical signal output device and moving an object across the three-dimensionally profiled surface to create a change in the electrical signal detectable by the electrical signal output device. A computer program is provided that is configured to, when executed, cause a computing device to perform the method. A system is provided that includes the sensor device and the computer program, the sensor device being electrically connectable to the computing device.

18 Claims, 28 Drawing Sheets

(51) Int. Cl.
*G06F 3/0354* (2013.01)
*G06F 3/041* (2006.01)
*H03K 17/96* (2006.01)

(52) U.S. Cl.
CPC .. *G06F 3/0416* (2013.01); *G06F 2203/04103* (2013.01); *G06F 2203/04809* (2013.01); *H03K 2017/9602* (2013.01)

(56) References Cited

U.S. PATENT DOCUMENTS

| | | | | |
|---|---|---|---|---|
| 9,682,716 | B2* | 6/2017 | Noffsinger | B61L 3/10 |
| 9,965,930 | B1* | 5/2018 | Christensen | H04M 1/026 |
| 2008/0122589 | A1* | 5/2008 | Ivanov | A61F 9/08 |
| | | | | 340/407.1 |
| 2009/0015560 | A1* | 1/2009 | Robinson | G06F 3/016 |
| | | | | 345/168 |
| 2009/0303022 | A1* | 12/2009 | Griffin | G06F 3/016 |
| | | | | 340/407.2 |
| 2010/0109486 | A1* | 5/2010 | Polyakov | H01L 41/0474 |
| | | | | 310/365 |
| 2010/0225340 | A1* | 9/2010 | Smith | G06F 3/011 |
| | | | | 324/713 |
| 2011/0102462 | A1* | 5/2011 | Birnbaum | G06F 3/04886 |
| | | | | 345/647 |
| 2011/0128239 | A1* | 6/2011 | Polyakov | G06F 3/016 |
| | | | | 345/173 |
| 2011/0234502 | A1* | 9/2011 | Yun | G06F 3/016 |
| | | | | 345/173 |
| 2013/0021278 | A1 | 1/2013 | Landau et al. | |
| 2013/0162582 | A1* | 6/2013 | Hatano | B60K 37/06 |
| | | | | 345/173 |
| 2013/0241890 | A1* | 9/2013 | Sharma | G06F 3/0425 |
| | | | | 345/175 |
| 2013/0275082 | A1* | 10/2013 | Follmer | G01B 21/00 |
| | | | | 702/155 |
| 2014/0139328 | A1* | 5/2014 | Zellers | G06F 3/016 |
| | | | | 340/407.2 |
| 2014/0139450 | A1* | 5/2014 | Levesque | G06F 3/016 |
| | | | | 345/173 |
| 2014/0225855 | A1 | 8/2014 | Aitchison et al. | |
| 2014/0232679 | A1* | 8/2014 | Whitman | G06F 3/0414 |
| | | | | 345/174 |
| 2014/0319969 | A1* | 10/2014 | Denes | F03B 13/14 |
| | | | | 310/339 |
| 2014/0320431 | A1* | 10/2014 | Cruz-Hernandez | G06F 3/016 |
| | | | | 345/173 |
| 2015/0355710 | A1* | 12/2015 | Modarres | G09G 5/003 |
| | | | | 345/173 |
| 2015/0370328 | A1* | 12/2015 | Backman | G06F 3/038 |
| | | | | 345/156 |
| 2016/0124510 | A1* | 5/2016 | Hyde | G06F 3/016 |
| | | | | 340/407.2 |
| 2016/0313793 | A1* | 10/2016 | Hong | G06F 3/016 |
| 2018/0057943 | A1* | 3/2018 | Tsukamoto | C23C 18/18 |
| 2019/0027674 | A1* | 1/2019 | Zhang | H01L 41/0472 |

OTHER PUBLICATIONS

GB Search Report, GB Patent Application No. GB1511042.2, dated Dec. 17, 2015.
GB Search Report, GB Patent Application No. 1610993.6, dated Nov. 2, 2016.
Murray-Smith et al., Stane: Synthesized Surfaces for Tactile Input, The 26th Annual Chi Conference on Human Factors in Computing Systems, CHI 2008 Conference Proceedings, Multitouch and Surface Computing, Apr. 5-10, 2008 Florence, Italy.
International Search Report, PCT/EP2016/025067, dated Sep. 12, 2016.
Written Opinion, PCT/EP2016/025067, dated Sep. 12, 2016.
Office Action for corresponding Japanese Patent Application No. 2017-567441 dated Jun. 30, 2020.

* cited by examiner

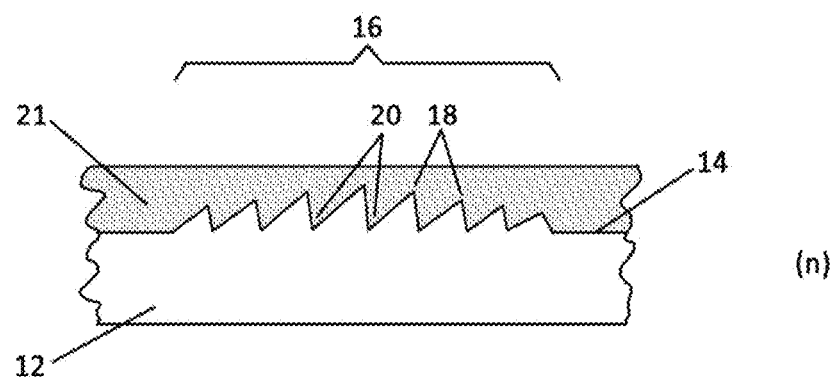
(n)
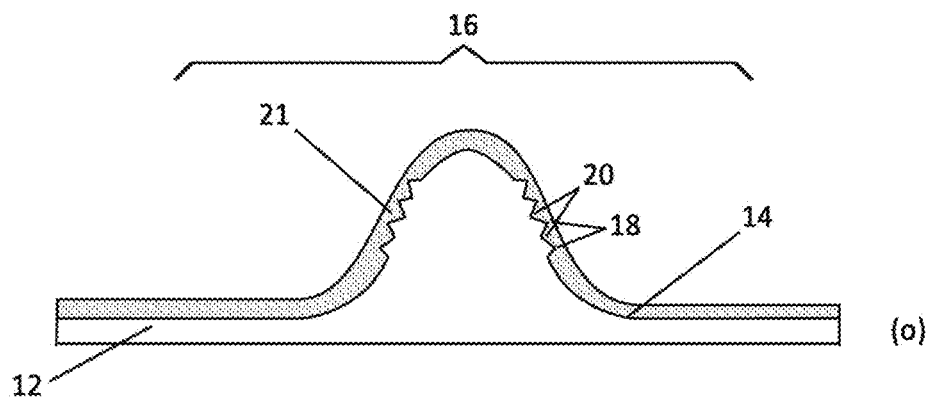
(o)
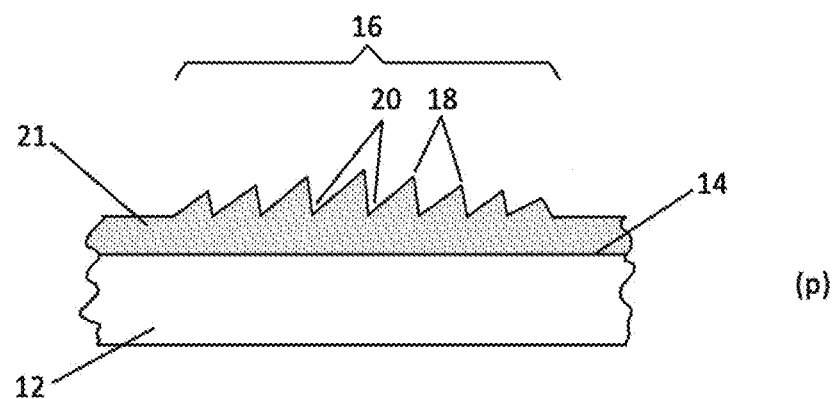
(p)
Figure 2

(q)

(a)

(b)

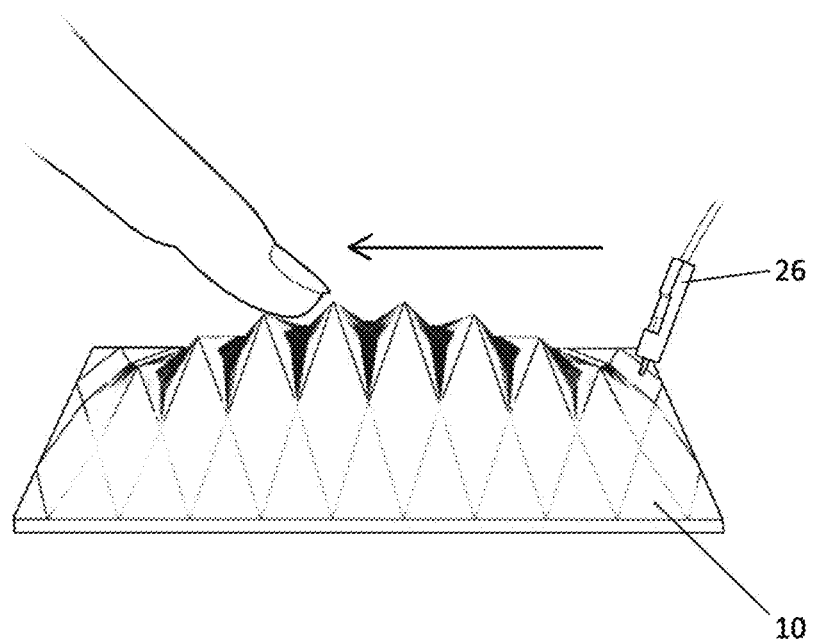
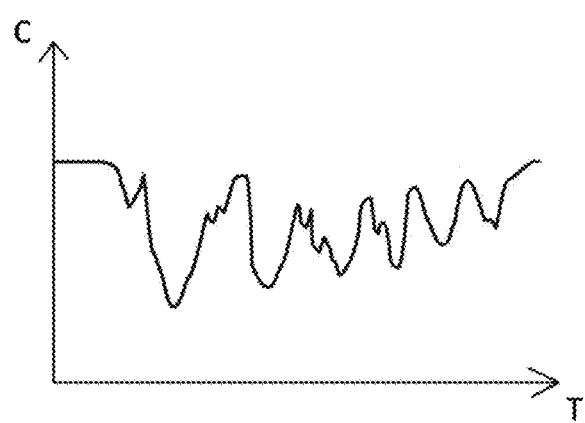
Figure 12

SENSOR DEVICE AND METHOD

CROSS-REFERENCE TO RELATED APPLICATIONS

This application is the U.S. national stage application of International Application PCT/EP2016/025067, filed Jun. 23, 2016, which international application was published on Dec. 29, 2016, as International Publication WO 2016/206819 in the English language. The International Application claims priority of Great Britain Patent Application No. 1511042.2, filed Jun. 23, 2015. The international application and British application are both incorporated herein by reference, in entirety.

TECHNICAL FIELD

The present invention relates to a sensor device and method of use and manufacture and, in particular, to a sensor device in the form of a three-dimensional tactile interface.

BACKGROUND TO THE INVENTION

Tactile sensors provide a way of obtaining information via a physical interaction with the sensor, and are commonly used in applications such as mobile and computing devices, robotics, and control systems. These may operate based on piezoresistive, piezoelectric, capacitive and elastoresistive sensing. For example, in a capacitive touch switch, a person needs merely to touch the sensor, which changes the capacitance within the sensor and triggers the switch. A variety of pressure sensitive materials are now available, including quantum tunneling composites, for use in pressure switching and sensing. These are utilized in soft robotics, heavy machinery and wearables. Examples including conductive inks have been developed to integrate sensitivity into the material itself and create "soft electronics". Three-dimensional (virtual reality) interfaces are also known.

It is known to provide a tactile interface for inputting data into a processor, the interface having a three-dimensionally shaped input surface and an array of sensors embedded thereunder. Application of a force to the input surface transfers force to the embedded sensor or sensors, producing a signal to a processor. Although the disclosed sensor is thereby able to provide information on the magnitude and location of the force applied, the construction required is somewhat cumbersome and difficult to manufacture. Furthermore, the provision of a sensor or an array of sensors limits the sensing area available. In addition, the translation of a force applied on the three-dimensional surface through the intervening soft resilient material to the sensor(s) may lead to inaccuracies and inconsistencies.

Aspects and embodiments of the present invention have been devised with the foregoing in mind.

SUMMARY OF THE INVENTION

The present disclosure describes embodiments of sensor devices, systems relating to sensor devices, methods of using sensor devices, and computer programs relating to sensor devices and methods of using sensor devices. "Computer program" as referred to here and elsewhere in the specification refers to a program operable to run on a computer or other processing device e.g. a mobile phone (including an iPhone), a tablet (including an iPad) etc.

According to an aspect, there is provided a sensor device for generating an electrical signal, the device consisting of an electrically conductive material having, at least in part, a three-dimensionally profiled surface configured to create a change in said electrical signal in response to movement of an object thereacross. In an embodiment, the sensor device may further have, at least in part, a three-dimensional form in addition to the three-dimensionally profiled surface. The profiled surface portion may be a separate part of the sensor device to the 3D form portion. The profiled surface may be provided on a 3D form portion. Where a 3D form portion is provided, this is configured to create a change in said electrical signal in response to force, pressure or contact therewith.

According to another aspect, there is provided a method of using the sensor device of the previous aspect, the method comprising connecting the sensor device to an electrical signal output device and moving an object across the three-dimensionally profiled surface to create a change in the electrical signal detectable by the electrical signal output device. In an embodiment, applying pressure or force on the three-dimensional form creates a change in the electrical signal detectable by the electrical signal output device.

According to another aspect there is provided a method of generating an electrical signal, the method comprising providing an electrically conductive material, and configuring the material, at least in part, with a three-dimensionally profiled surface such that movement of an object thereacross creates a change in the electrical signal. In an embodiment, the method comprises configuring the material, at least in part, with a three-dimensional form such that pressure or contact therewith creates a change in the electrical signal.

According to another aspect there is provided a computer program configured to, when executed, cause a computing device to perform the method of the previous aspects. According to another aspect there is provided a system comprising the sensor device of any of the aspect above and the computer program of the aspect above, configured to execute on a computing device, the sensor device being electrically connectable to the computing device.

In embodiments of the above aspects, the three-dimensionally-profiled form or surface may be textured. The three-dimensionally profiled form or surface may be textured with a regular or irregular geometric pattern. The geometric pattern may be formed by a variation in elevation and/or depression across the surface of the electrically conductive material. The geometric pattern may comprise a plurality of discontinuities and/or undulations. The geometric pattern may comprise a plurality of peaks and troughs across the surface in a pattern. The geometrical pattern may be substantially a repeating waveform such as a saw tooth, sine wave or square wave. The geometric pattern may be configured so as to provide a change in electrical signal when subjected to a force or pressure or movement in a direction across the pattern.

In aspects and embodiments, the device may comprise a unitary and conductive material formation e.g. in a flat sheet, block or other flat or 3D shape having a textured surface. In embodiments the surface itself is substantially smooth (being e.g. flat or curve) with textured, patterned, ridged etc. portions provided therein. Alternatively, the device may comprise a material formation (conductive or otherwise) e.g. in a flat sheet, block or other flat or 3D shape having a textured surface, with an additional conductive coating/layer applied to that textured surface. Alternatively, the device may comprise a material formation—conductive or otherwise—e.g. a flat sheet, block or other flat or regular 3D shape having a conductive and textured surface, where the coating or layer itself is textured and conductive. All of these fall within the scope of the aspects and constitute an electrically conductive material having a three-dimensionally profiled surface as claimed.

The device consists of, essentially consists of, or comprises an electrically conductive material having a three-dimensional form or a three-dimensionally profiled surface. "Three-dimensional" as used herein can refer to a texture or profile provided on a surface, planar or otherwise, and/or to a non-planar surface or shape. Moving an object (e.g. a person's finger) across the surface, and/or applying a pressure or force or otherwise making contact with the surface, causes a change in the electrical signal.

The conductivity of the material can be variable or inconsistent across or through the material. In other words, the conductivity of the unitary piece of material can be modulated. For example, the distribution of conductive parties throughout the material can vary, or different parts of the material can have different conductivities. The device may comprise, in part, non-conductive material. For example, it can have a stretchable textile cover to gain a different exterior finish. Alternatively, it can have internal structures made out of non-conductive plastics.

This can provide one or more areas of relatively higher or lower conductivity, zero or near-zero conductivity as compared with the rest of the material.

This advantageously provides for enhanced signal detection and distinguishing capabilities and for tailoring the material for particular uses. Specifically, providing a 3D profile provides for regulating a signal to enhance sensing functions on a single uniform surface without the need for additional sensors. It also provides tactile and visual guidance for the user. Additionally, it enables certain movements to be applied to the material e.g. pressing, twisting, squeezing.

In an embodiment the conductive material is pliable, deformable and/or has elastic properties and may be flexible. In an embodiment, the electrically conductive material is a soft silicone rubber material or rubber-based compound material. The material may comprise an electrically conductive material, e.g. in the form of embedded particles or filler, such as graphite. The material can have a range of hardness properties (depending on the silicone base) with controllable conductivity (depending on the graphite ratio). The electrically conductive material may also comprise a stretchable fabric layer and/or electrically conductive paint e.g. on one of its sides. The electrically conductive material may also or instead be coated with a thin layer of non-conductive material to provide a desired product finish. In an alternative embodiment, the electrically conductive material is a rigid electrically conductive material such as a conductive metal (e.g. aluminium).

In either case, the sensor material is tactile and sensitive to different interactions. The material has tactile properties that can take a variety of different forms to provide an exterior surface with some variation to provide tactility. For example, one or more areas may be smooth, others may have angular facets or constructions such as small triangular planar faces which could suggest a movement direction of the human hand. Contacting, pressing or moving across the surface causes a detectable electrical change. This enables the provision of a switching element operable for sensing continuous capacitance change when touched by human hands. Touching the material grounds it, causing a change in the electrical signal, which can be detected and measured. The reading is proportional to the contact area.

The electrical signal may vary over time and is preferably a voltage or a capacitance and movement of an object across the device and/or pressure or contact with the device causes a change in the voltage or a capacitance. The signal may be a real time value and may be a sequence of values spanning a length of time. Preferably, the electrical signal is monitored over a period of time, and processed to interpret touch location on the device, speed of movement of the object across the surface of the device and/or direction of movement of the object across the surface of the device.

Embodiments of the invention provide for both single point and multiple point sensing. Embodiments of the invention provide for sensing touch position, touch pressure, movement speed, movement direction and touch location or proximity to a measurement sensing location. Multi-touch interactions may be improved by modulating the conductive material e.g. using a spray coating to modulate the surface and/or by varying the conductivity of the material in different areas, e.g. by varying quantity of conductive particles in the silicone. A multi-touch zooming function could be achieved by pressing into the soft material.

The three-dimensionally profiled surface may be textured e.g. with a geometric pattern. The texture or pattern may comprise variations in elevation across the surface of the electrically conductive material. The geometric pattern may comprise undulations and/or areas of relative raised and lowered surface such as a plurality of peaks and troughs across the surface. The variation or pattern micro scale may be regular or irregular. The distance between successive peaks and troughs may be equal, may progressively increase or decrease, or be irregular. The texture or pattern may be configured so as to provide a different change in electrical signal when subjected to a force or pressure or movement in a direction across the pattern. The texture or pattern may be repeating and may resemble a waveform such as a saw tooth, sine wave or square wave. The repeating nature of the waveform may include small variations, e.g. changes of peak height, distance between peaks etc. but with an overall repeating nature.

The scale of the texture be micro- or non-micro-scale and can e.g. vary from substantially 0.05 mm to the order of 50 mm, perhaps to the order of 200 mm. In an embodiment, the peak distance is substantially 1 mm-30 mm, or substantially 1 mm-10 mm, or may be substantially 5 mm-10 mm.

Aspects and/or embodiments of the invention advantageously provide a sensor or tactile interface that can be made to any three-dimensional form with a single material. In its simplest form, a single, possibly uniform, material may be provided for relatively simple functions. In some embodiments, a thin layer of material with a conductive coating on one side may be used, or a conductive module may be cast and a non-conductive filler provided over it. These embodiments still embody the idea of having a body of material that itself is the sensor. In all aspects and/or embodiments, no separate sensing components (e.g. underlying sensor arrays) are required. Embodiments of the invention thus facilitate interactions with high fidelity, whilst the sensor device itself is simple and inexpensive to manufacture. The sensor device also provides enhanced design possibilities and user experience. The invention provides a sensing medium, and especially a capacitive sensing medium, that simulates touch pressure, location, movement speed, movement direction and touch location or proximity from the sensing location.

The material may be connected to a computing or processing device. This is intended to be construed broadly, and to cover personal and mobile computing devices as well as other intelligent devices comprising a processing means such as a television controller, gaming console controller, onboard vehicle control systems and the like.

The computing or processing device may be configured to host instructions for enabling processing of the output signal from the device. The system may have an input/output data interface. The system may include a processor, a storage device, and a non-transient machine-readable storage medium. The machine-readable storage medium may include instructions which control how the processor receives input data and transforms the input data (the electrical signal) into output data e.g. on the screen, a connected printing device or via an audio output. The machine-readable storage medium in an alternate example embodiment is a non-transient computer-readable storage medium.

In an embodiment, a computer program is provided which, when run on the computing or processing device, causes the computer to perform any method disclosed herein. The computer program may be a software implementation, and the computer or device it runs on may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as a transient signal. Such a transient signal may be a network download, including an internet download. In some aspects and/or embodiments, if a person moves their finger against a three-dimensionally formed material, the capacitive signal graph simulates the pressure of the touch and the 3D form provides a tactile feedback to the person. An initial signal sequence through a short period of time may be sampled to interpret touch location, then the real-time signal can simulate pressure sensing. In other aspects and/or embodiments, when a person moves their finger across a textured three-dimensional surface, the capacitance signal graph resembles or approximates or can be interpreted to describe the geometry condition. The geometry can be modelled in CAD software and then put into a parametric program (e.g. grasshopper) to adjust the teeth angle, height and density. The signals are thus repeatable and programmable such that the software is able to compare a measured signal with a pre-modelled signal waveform and, where there is a match, indicate information to a user such as the location of touch on the material surface, the direction of movement across the surface, the pressure or force a person uses etc. Other algorithms may also be used to detect the movement direction, touch speed and position. For example, the movement speed can be calculated by calculating the distance between the signal change peaks frequency. Movement direction can be detected by comparing the peak value changes, and location can be detected based on the relative displacement. Here, the user does not have to finish the swiping motion on a single texture unit to interact.

The computer program may be configured to, when execute, carry out the method(s) or processes described herein.

Features which are described in the context of separate aspects and embodiments of the invention may be used together and/or be interchangable. Similarly, where features are, for brevity, described in the context of a single embodiment, these may also be provided separately or in any suitable sub-combination. Features describes in connection with the device may have corresponding features definable with respect to the method(s) and the computer program and these embodiments are specifically envisaged.

Aspects and embodiments of the invention thus describe an interrelationship between three-dimensional forms, physical interaction and electrical output. Aspects and embodiments of the invention incorporate a sensing or switching element formed of an electrically conductive material having a surface geometry design and may also comprise signal processing algorithms.

Embodiments of the invention have various advantages. The ability to make a sensor from a single material or the interface material itself without the need for additional sensor pads etc. provides for a much simpler assembly process, minimises material usage and reduces electronic waste. The manufacturing process is therefore a lot more cost effective. Embodiments of the invention achieve a signal processing interface without the need for complicated sensor arrays and the associated calibration procedures. User testing also revealed the notion of the device having the ability to associate a feeling with an action due to the enhanced tactility of the sensor in comparison to known devices.

A traditional keyboard or touch sensing track pad is typically made of more than 300 parts, which may need to be sourced from multiple suppliers. Assembling a traditional keyboard or touch sensing track pad is laborious due to the high number of components used. In addition, from the point of view of recycling and downgrading, this involves difficult material separation and a high cost dissembling and recycling process (involving chemical separation processes). A quantum tunneling composite might require a mixing process with a much higher production cost/retail price, and can only perform as a single pressure-sensing switch element. Sustainability is challenging due to the information needed to separate the quantum particle content. Embodiments of the present invention, on the other hand, merely require a one-part moulding process with a consequentially lower production cost. Advantageously, they can perform much more complicated sensing functions on one uniform surface. The device is designed for material separation and has a low cost dissembling process. Advantageously, embodiments of the invention require inly low labour involvement and a simple physical detach dissembling process.

Embodiments of the invention will now be described with reference to the Figures of the accompanying drawings in which.

Figure 11:
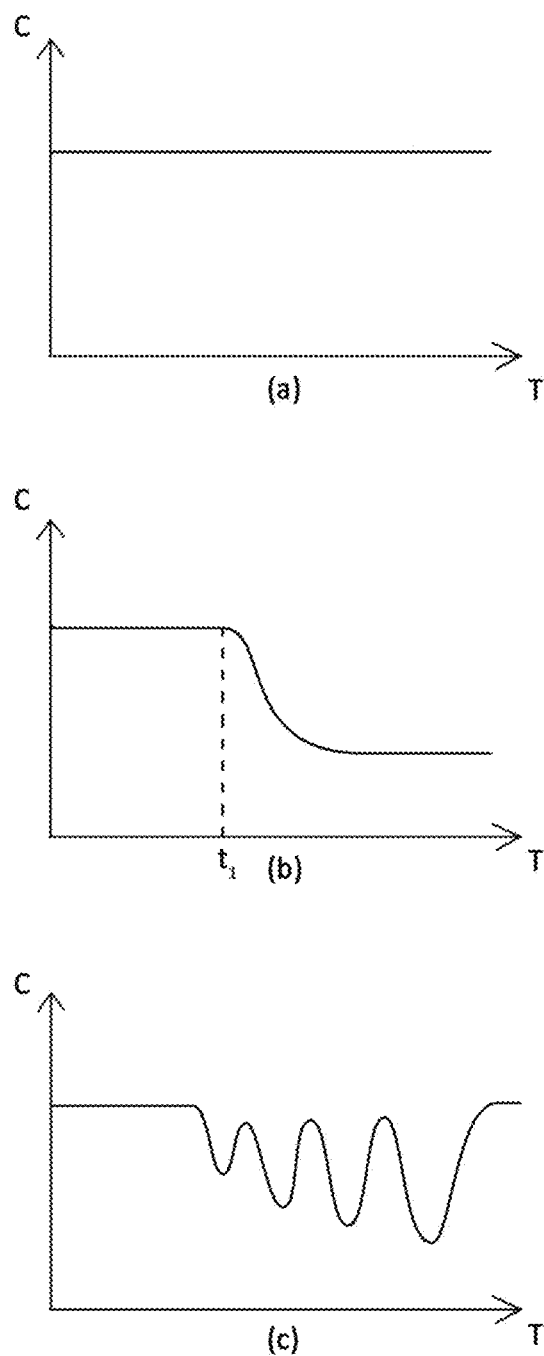
Figure 13:
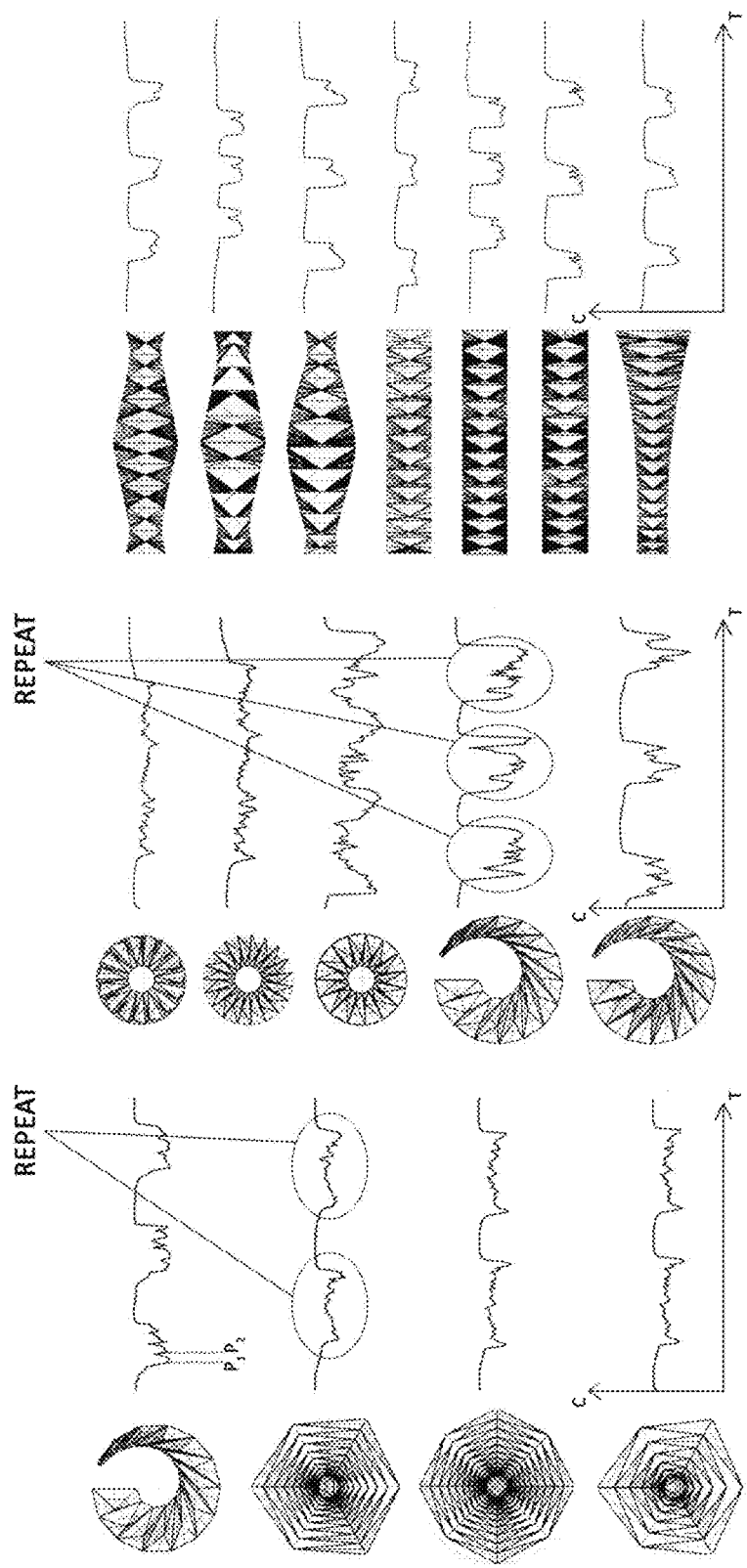

FIG. 11 schematically shows output signals obtainable from a sensor device according to an embodiment of the present invention;

FIG. 12 shows a sensor device according to an embodiment of the present invention with an electrical connection and an exemplary output signal;

FIG. 13 shows schematic views of exemplary surface geometries for a sensor device according to embodiments of the present invention together with corresponding exemplary output signals;

FIG. 14 shows sensor devices according to embodiments of the present invention with electrical connections and corresponding exemplary output signals;

FIGS. 15 to 19 provide examples of use of embodiments of the present invention.

DETAILED DESCRIPTION OF EMBODIMENTS OF THE INVENTION

Figure 1:
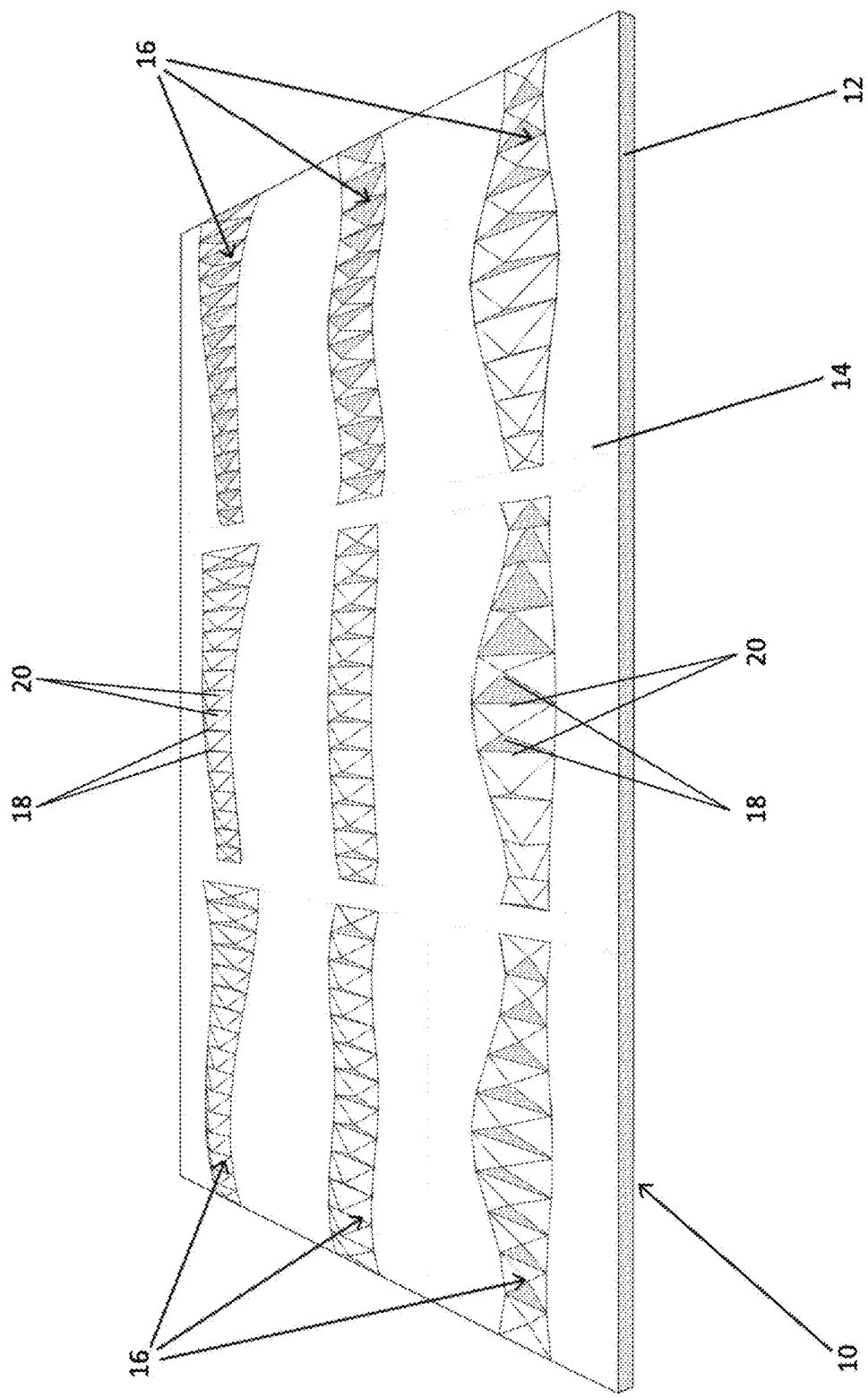
FIG. 1 shows a sensor device according to an embodiment of the present invention.

FIG. 1 shows an electrically conductive material or at least in part conductive material 10 in the form of a generally planar sheet 12, e.g. formed of a silicone rubber containing carbon filler and conductive metal particles. In an embodiment the material is silicone rubber mixed with graphite at a ratio of 5:1 to 1:5 by weight. A possible alternative ingredient is rubber and/or TPU (thermoplastic polyurethane) or a type of TPE (thermoplastic elastomer) which is, or could be, advantageously, recyclable. In another embodiment the material can be a thin material (e.g. plastics, silicone or fabrics) layer coated with a conductive material (e.g. nickel or graphite) on one side. Alternatively, a hard material such as a conductive metal (e.g. aluminium) could be used.

In either case, but more practically for the "soft" material embodiments, the conductivity of the material can vary across and through the material. This can be achieved by varying the concentration of the conductive component within the material so as to provide areas of different conductivities. This may also be achieved by modulating conductive components or separating conductive areas (e.g. applying conductive materials to separated areas on one piece of fabric material) Areas of different conductivities will produce a different electrical signal. Thus, even if two areas of a material 10 were profiled in the same way, if these areas had different conductivities, moving an object across their surfaces would generate different electrical signals enabling them the be distinguished. In this way, the location of the moving object on can be detected by a program.

The surface 14 of the sheet 12 is profiled with areas 16 that each comprise three dimensional or non-planar features. Each area 16 comprises a plurality of features or peaks 18 that extend outwardly from the planar surface 14 defining a series of troughs 20 therebetween. The surface 14 of the sheet 12 is thus configured to have a three-dimensional geometric texture relative to the surface of the sheet 12. The three-dimensional patterns have a generally saw-tooth profile in cross section, as is also shown in FIG. 2(a). In alternative embodiments, the properties of the saw-tooth profile can vary, e.g. whether or not the "cliff" is vertical or how steep the "ramp" is, or whether the profile is symmetric or asymmetric. In an alternative embodiment (not shown) the saw-tooth could be formed in rather than on the surface 14 such that the geometry is embedded within the surface of the sheet rather than protruding above it. An example is provided in FIG. 2(b). In another embodiment there could be a combination of both e.g. where the cliff increases to a distance beyond the level of the surface 14 and the ramp extends below the level of the surface 14. An alternative configuration such as a triangle, square and sine wave form could alternatively or additionally be used, as exemplified in FIGS. 2(c) to 2(e). FIG. 2(f) shows an example in which the peaks 18 progressively, but uniformly increase in height and/or separation across the surface 14. In FIG. 2(g), the peaks 18 progressively, but uniformly increase and then decrease in height and/or separation across the surface 14. In addition or alternatively, an irregular waveform could be used, e.g. as shown in FIG. 2(h). Alternative waveforms, e.g. such as that shown in FIG. 2(i) could be used. Of course, these and other embodiments can be used in any and all combinations, an example of which is shown in FIG. 2(j).

In some cases, in order to better facilitate a smoother touch motion, the peaks 18 and troughs 20, or saw-tooth profiles are designed as a continuous surface creating a shark-gills-like profile, an example of which is shown in FIG. 2(k) both from a side view and a perspective view.

Figure 2:
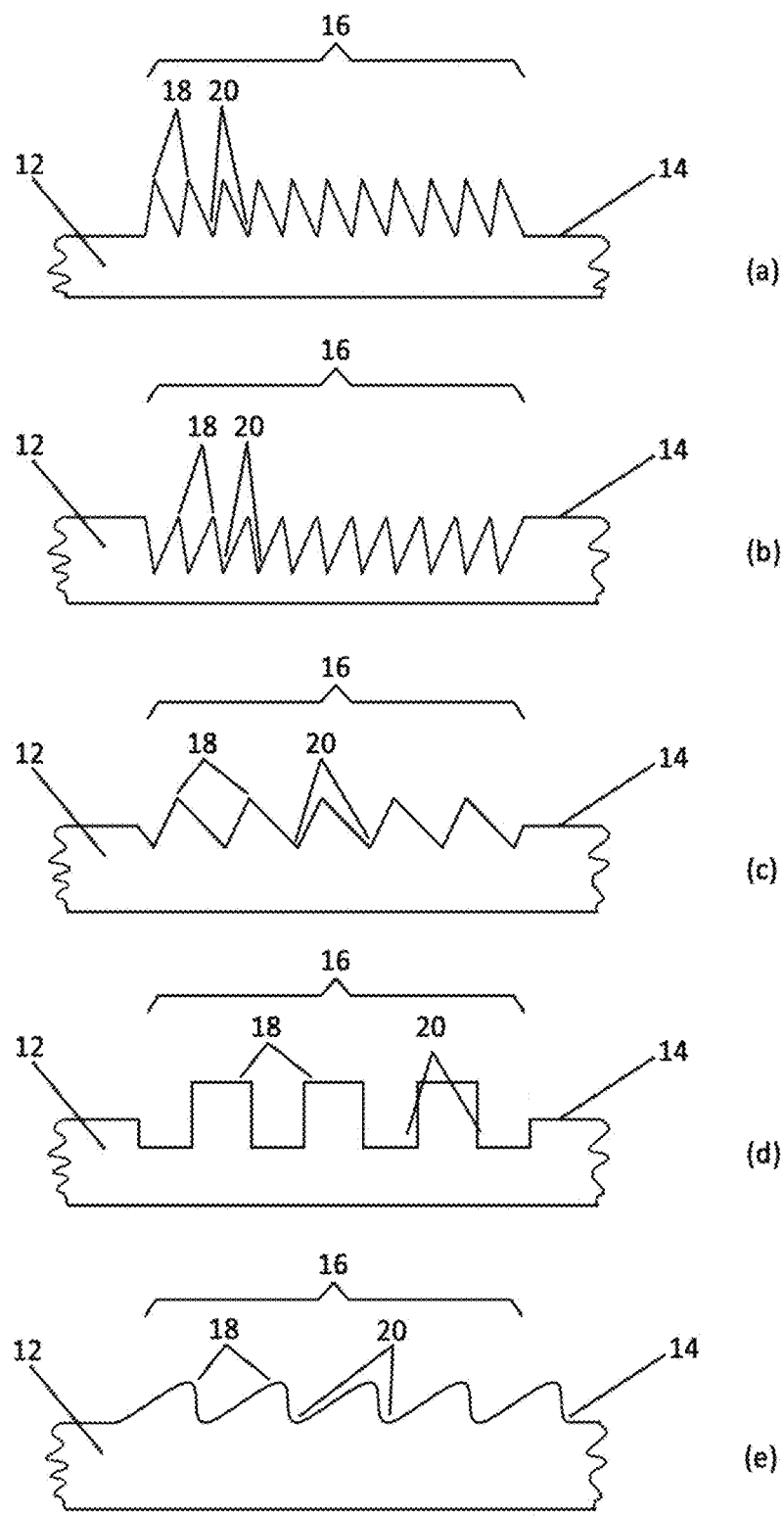
FIG. 2 shows exemplary surface geometries for a sensor device according to embodiments of the present invention.
Figure 2:
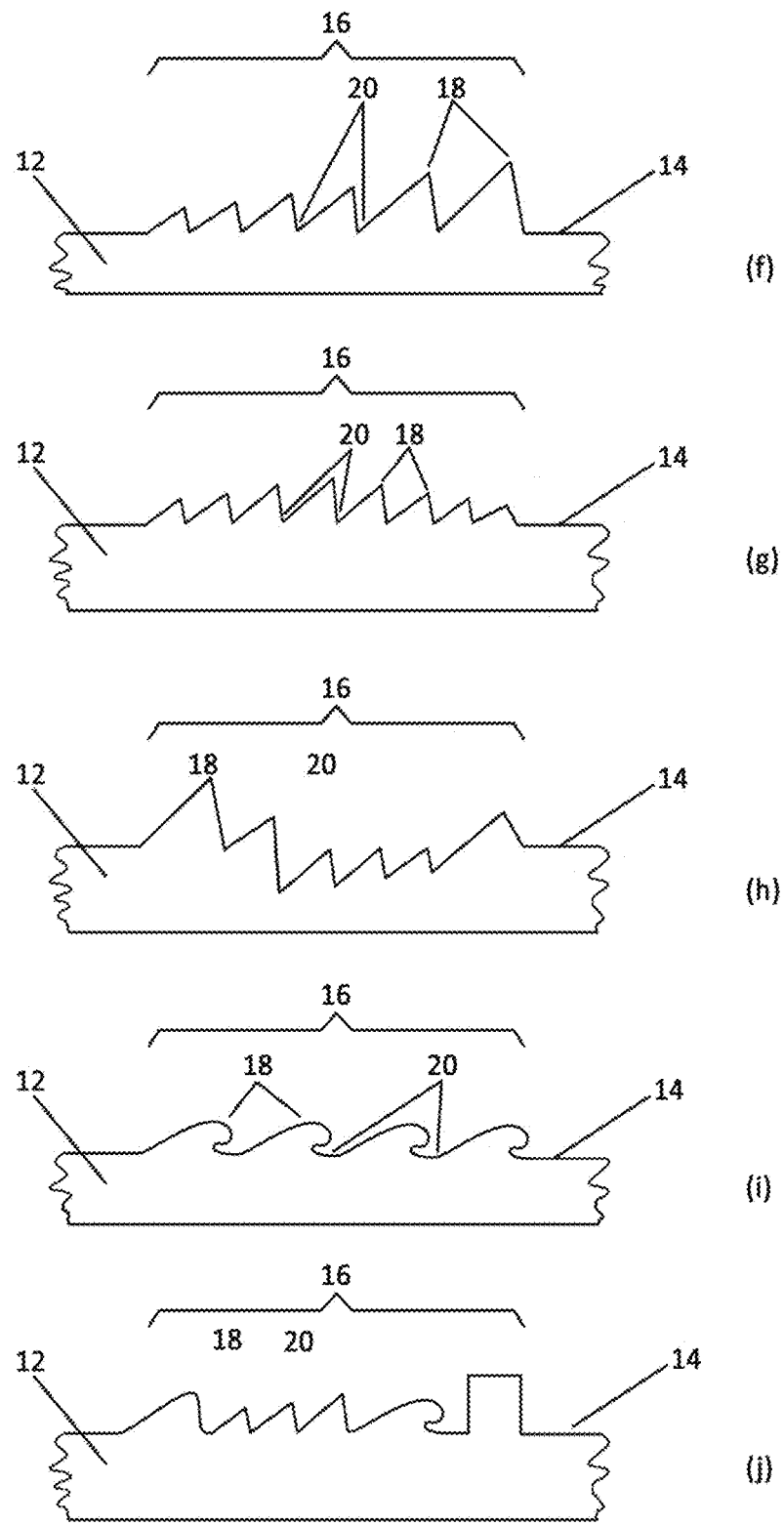
Figure 2:
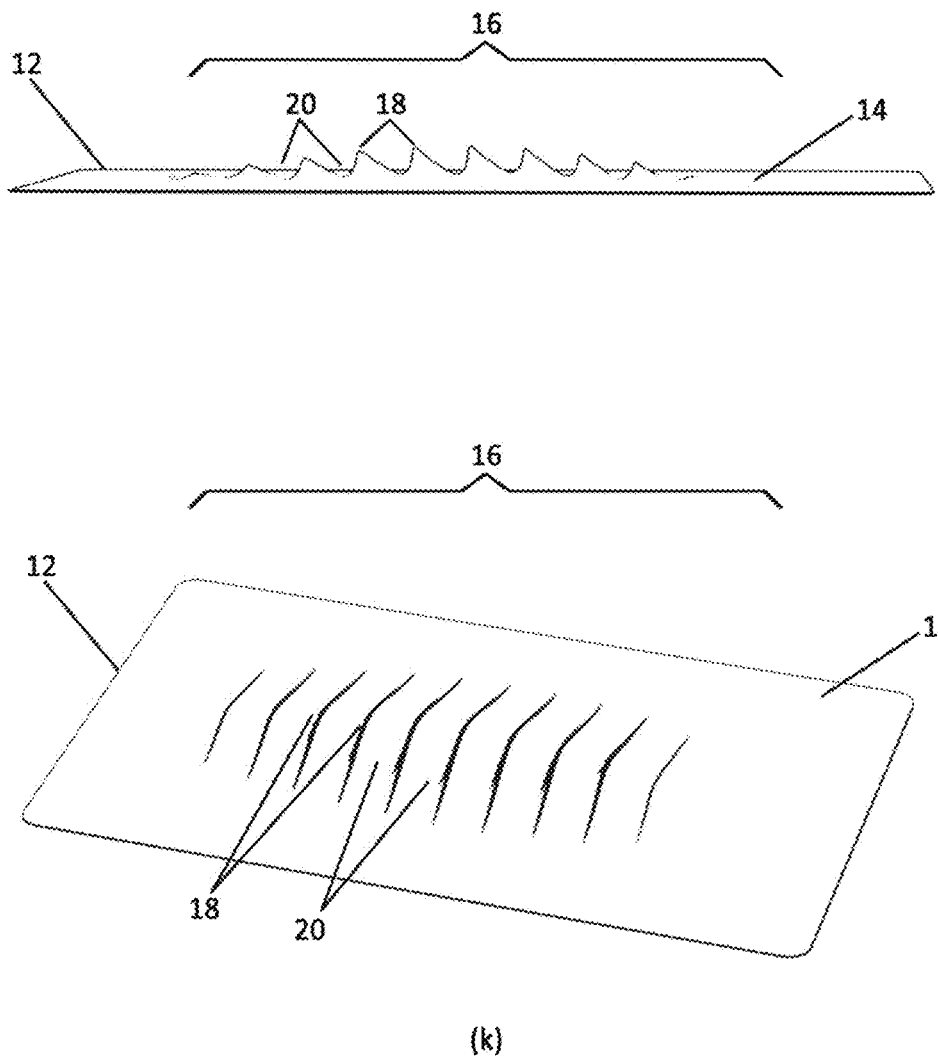
Figure 2:
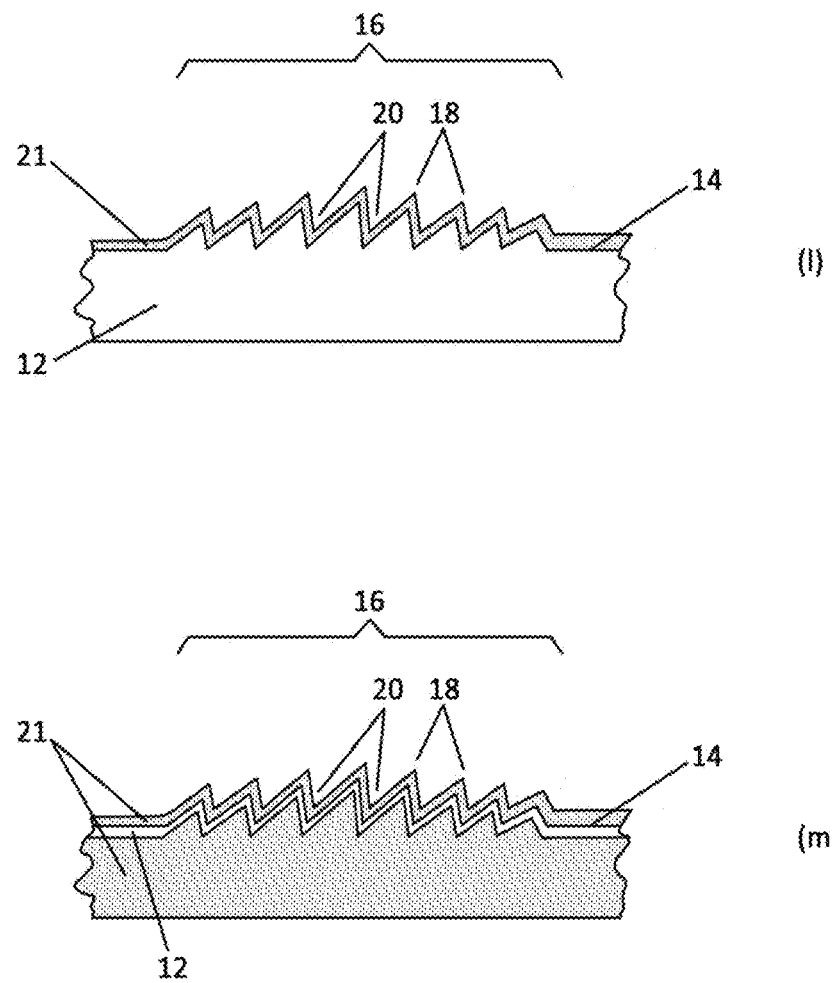
Figure 2:
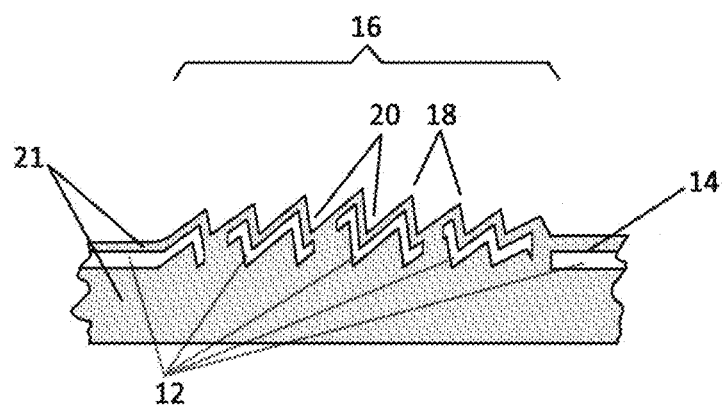

Alternatively, in order to have a different tactile surface finish, e.g. using PVC, leather or a thermo-plastic elastomer, an insulation material layer may be applied on top of the mentioned 3D texture profiles, having similar texture profiles. FIG. 2(l) shows an example in which the texture peaks 18 and troughs 20 are embedded underneath an insulating material with a similar texture profile 21. FIG. 2(m) shows an example in which the texture peaks 18 and troughs 20 are embedded in-between 2 insulating materials with a 3 dimensional profile surface 21. In these cases, the textured surface/material 12 is conductive. The conductivity may be achieved by a conductive spray paint or conductive material printing. The insulating layer is preferably non-conductive. Of course, the texture features peaks 18 and troughs 20 in these two cases cover all examples mentioned in from FIG. 2 (a) to Figure (k) and their derivatives.

In some cases, in order to control the human hand/finger moving trajectory, an insulating material layer may be applied on top of the mentioned 3D texture profiles. FIG. 2(n) shows an example in which the texture peaks 18 and troughs 20 are embedded underneath an insulating material with a planar surface 21. FIG. 2(o) shows an example in which the texture peaks 18 and troughs 20 are embedded underneath an insulating material with a 3 dimensional profile surface 21. FIG. 2(p) show an example in which the texture peaks 18 and troughs 20 are implemented on the insulating layer 21, which is to better control the finger's (or other conductive objects') moving trajectory. The conductive layer 12 in this case can be 3 dimensionally profiled or merely a planar surface. In these cases, the insulating layer 21 is preferably non-conductive. Of course, the texture features peaks 18 and troughs 20 in these three cases cover all examples mentioned in from FIG. 2 (a) to Figure (k) and their derivatives.

In other cases, the conductive material may be modulated to achieve different conductivity across and surface. FIG. 2(q) shows an example.

A common feature is that the profile has a height that varies across the surface 14 or extent of the material 12. It is also not essential that each peak or ridge be equidistant or of equal height. Embodiments of the invention can accommodate and utilize variations. As such, FIGS. 1 and 2 are examples only, but have in common the provision of a variation, across areas of the surface, in the surface height or depth. The distances between the peaks or troughs may regular and be equal or progressively increase or decrease, or be irregular. The scale of the texture peak distance can vary from about 0.05 mm to about 200 mm and possibly down to about 50 mm, but could go down to pm scales. The depth (height difference) of the texture can also vary e.g. from approximately 0.1 mm to several cm, but can also go down to about 0.1 pm.

Figure 3:
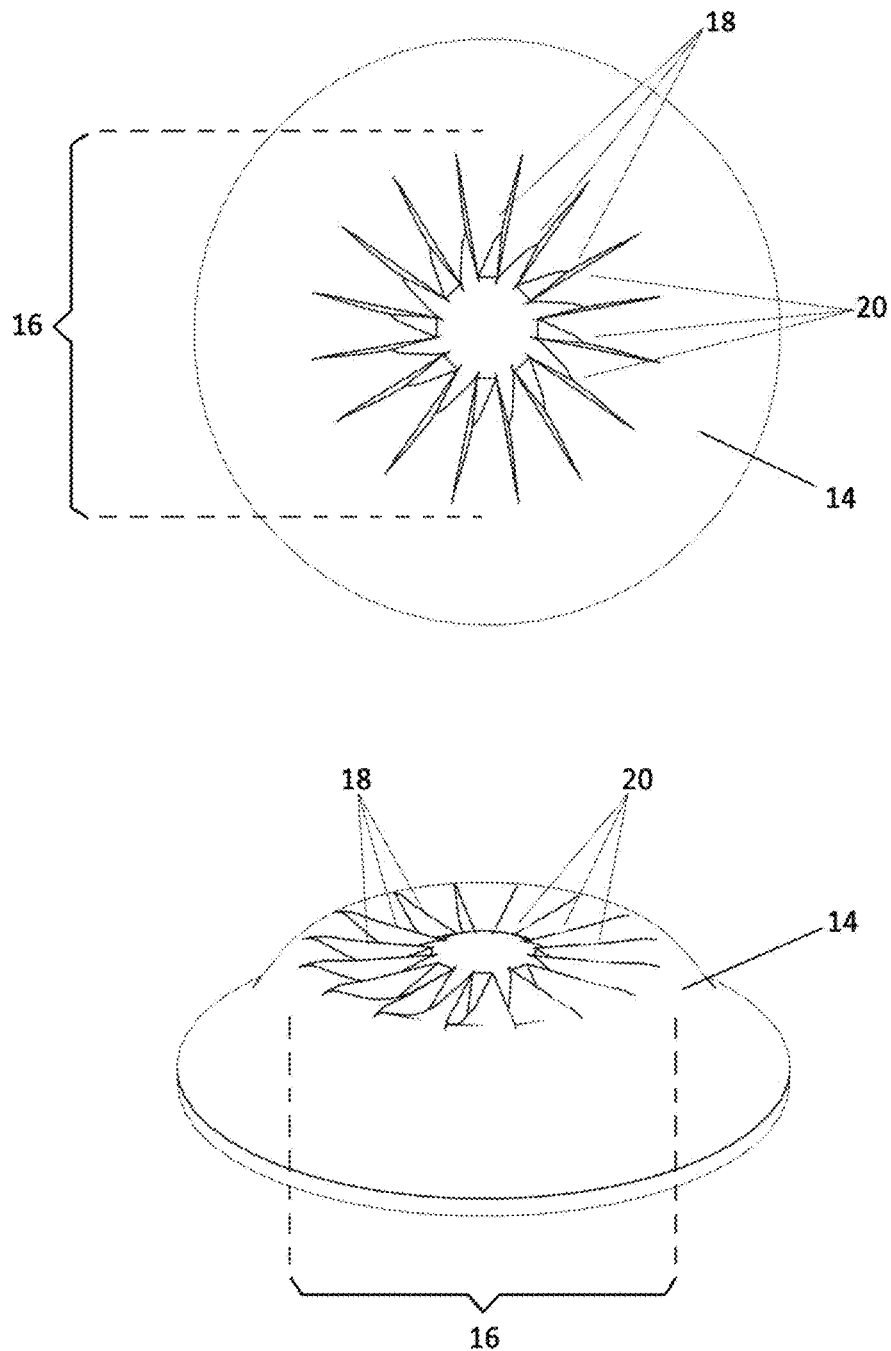
FIG. 3 shows a sensor device according to another embodiment of the present invention.

The examples of FIG. 1 show linearly extending geometries. FIG. 3 shows an alternative embodiment from two perspectives in which the geometric pattern is radial in nature. In alternative embodiments, a combination of both could be used. Similar to the embodiments of FIGS. 1 and 2, however, the pattern comprises a plurality of portions of the surface that are raised relative to the surface 14. As above, the pattern could also or instead be inset within the surface 14 such that the pattern comprises a plurality of portions of the surface that are elevated relative to (or dip below) the level of the surface 14.

Figure 4:
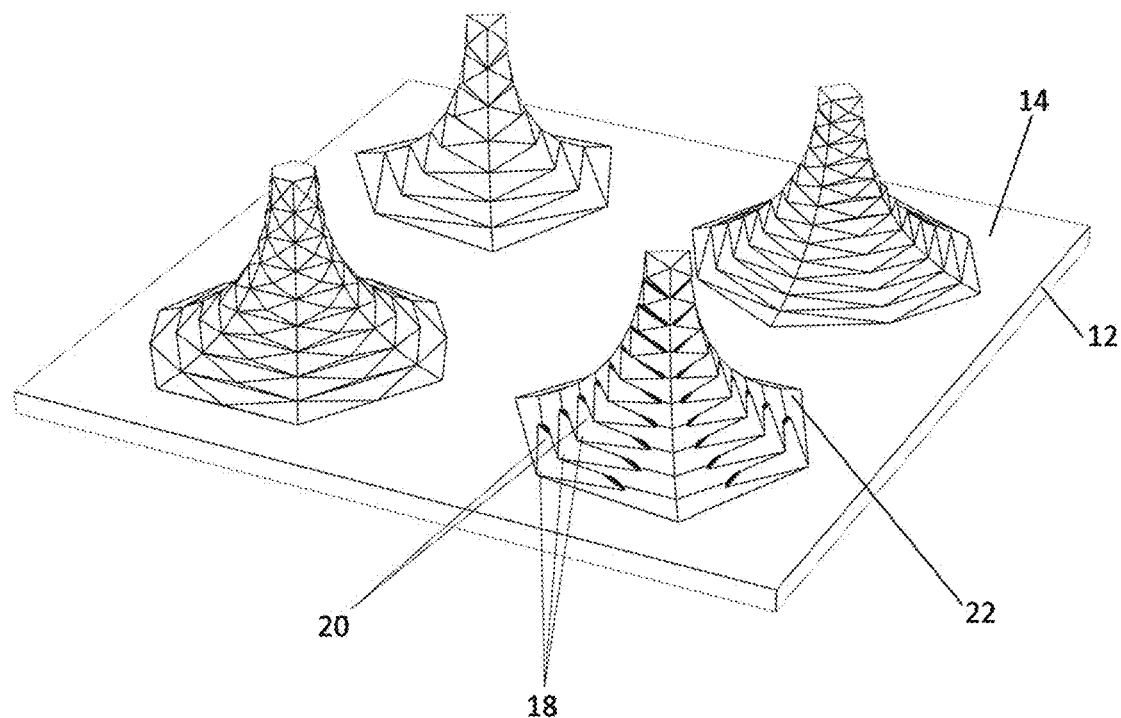
FIG. 4 shows a sensor device according to another embodiment of the present invention.
Figure 5:
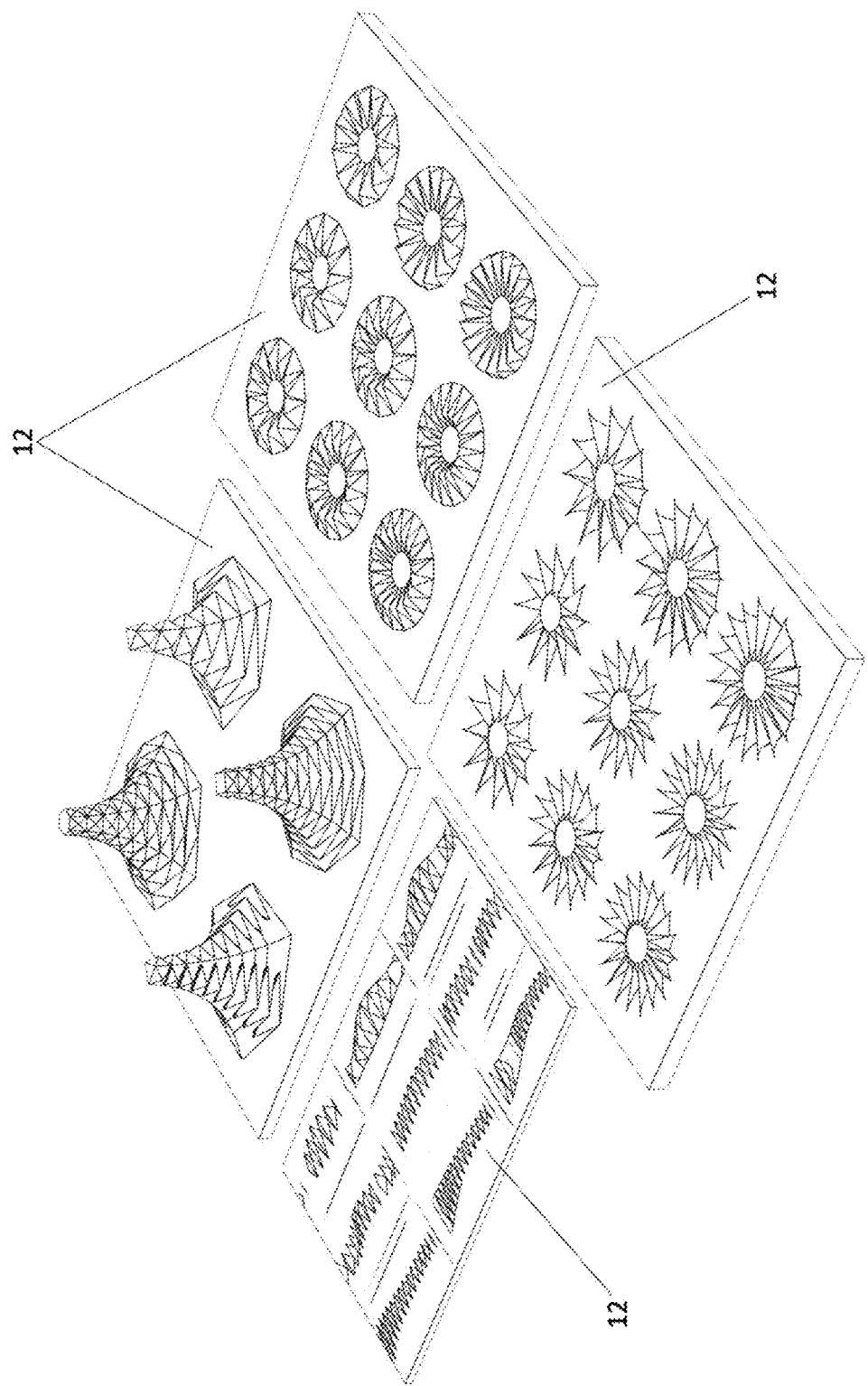
FIGS. 5 to 6 show sensor devices according to further embodiments of the present invention.

FIG. 4 shows a further alternative embodiment in which the geometric texture 18, 20 is provided on a three-dimensional structure 22 that itself extends out of the surface 14. Alternatively, a larger opening or crevice could be provided in the sheet 12 or in a deeper structure formed of the electrically conducting material. As before, in all embodiments, the overall structure provides a variation in structure height in relation to the surface 14 and/or surface of the base three-dimensional structure 22. FIG. 5 shows various different embodiments implemented on or within a planar sheet of electrically conductive material 12.

Figure 6:
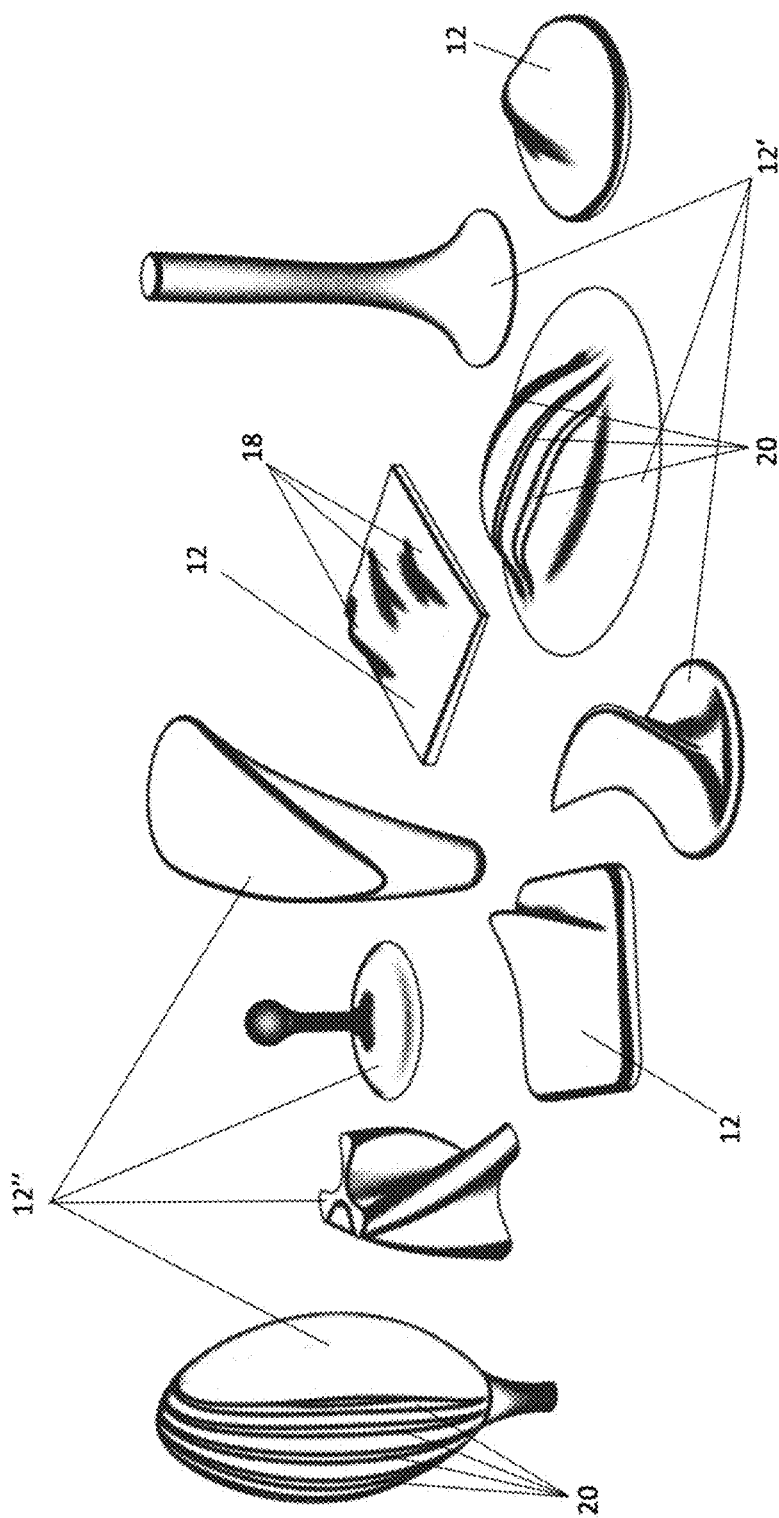

FIG. 6 shows alternative embodiments, some of which comprise a planar sheet or substrate 12, others of which have a curved or other three-dimensional substrate 12'. In some embodiments, the entire structure 12" is three-dimensionally profiled. Some embodiments may comprise a plurality of protuberances 18 and/or grooves 20 as in the embodiments of FIGS. 1-5.

Figure 7:
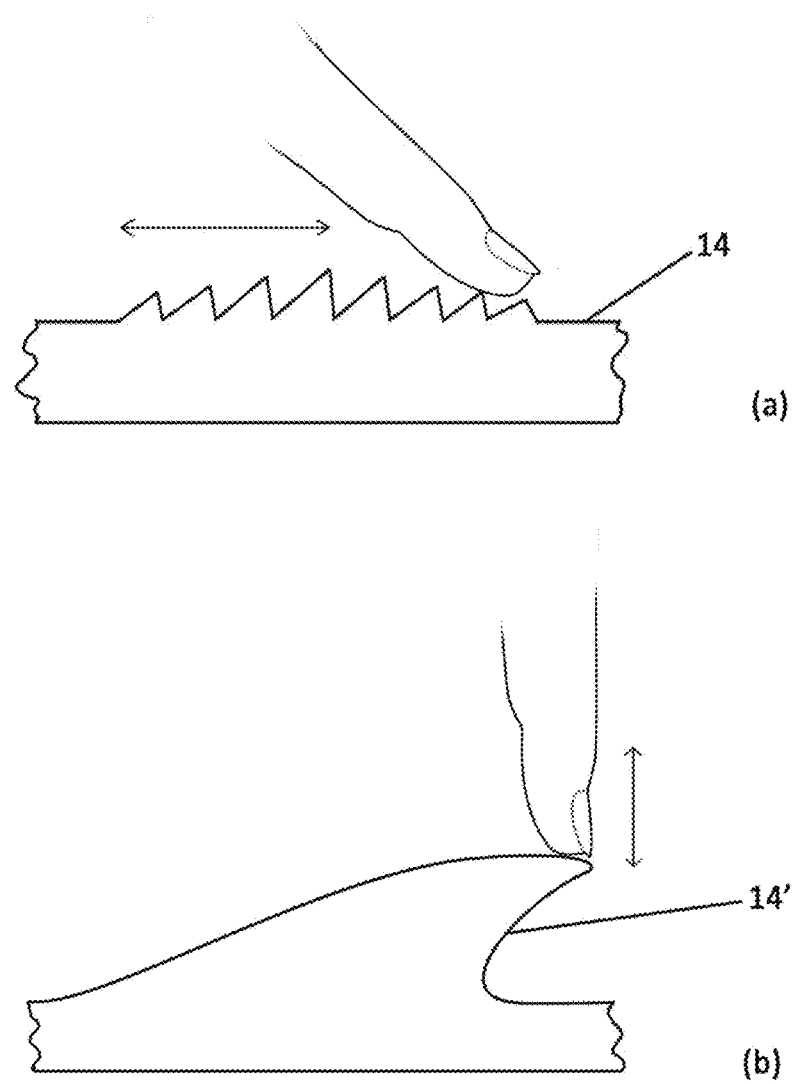
FIG. 7 is a schematic representation of the cross section or side view of a sensor device according to an embodiment of the present invention.

In other embodiments, the surface 14 (or a portion thereof) is contoured so as to provide a discontinuity or variation in elevation (e) of the exterior surface 14 (see e.g. FIG. 7(a)), or the surface 14' (or a portion thereof) is contoured so as to provide a variation or change in the gradient or contour of the exterior surface 14' (see e.g. FIG. 7(b)).

Figure 8:
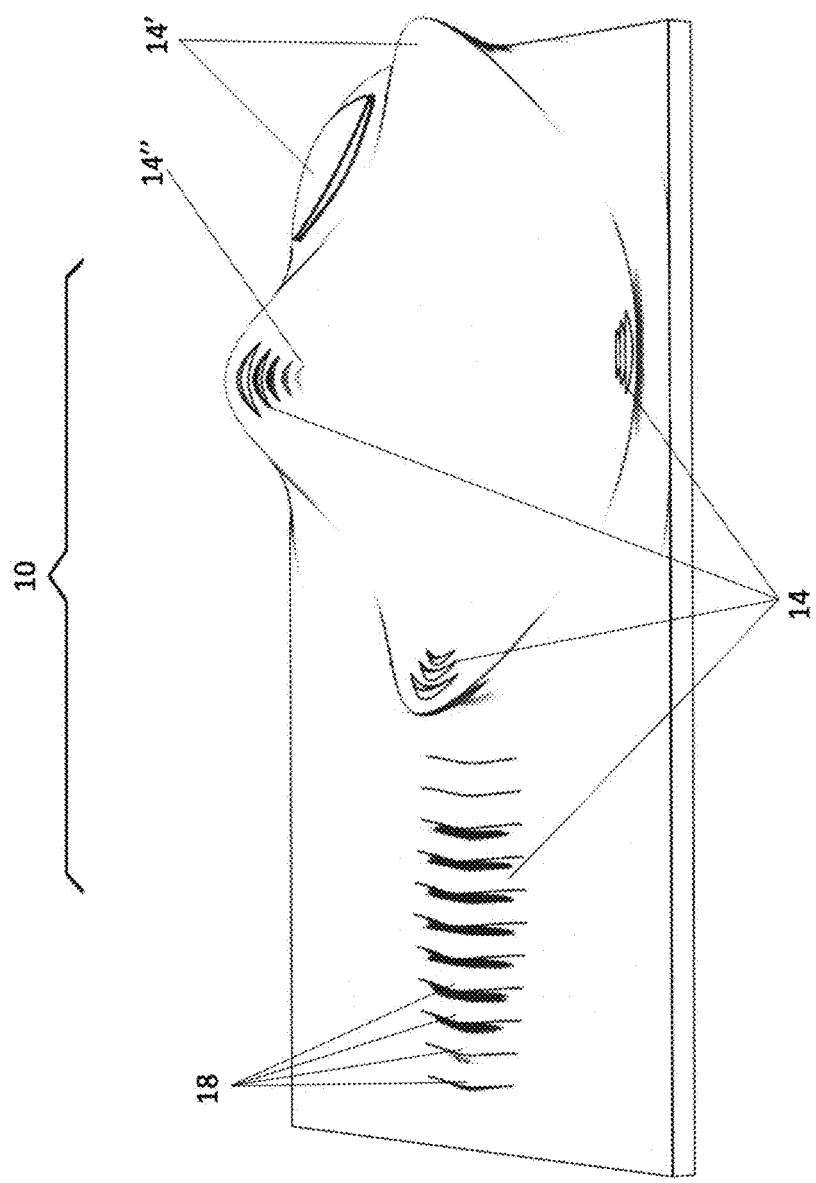
FIGS. 8 to 9 show sensor devices according to another embodiment of the present invention.

It is also possible, in an embodiment, to include structures of each of these two types. For example, FIG. 8 shows a hybrid structure 10 having an exterior surface comprising a portion of the surface 14 that is textured with a plurality of protrusions 18 and a portion of the surface 14' that is itself a three-dimensional geometry. In the area 14" in between portions 14, 14', the two three-dimensional geometries morph or blend into each other to give a smooth transition. In FIG. 8 there are four parameter sets (sets of texture 18, 20) which can be utilised for controlling different parameters, by interacting with a conductive object moving across the surface. And there are five parameter sets (sets of surface 14') which can be utilised for controlling different parameters, by interacting with a conductive object moving against. The two types of structure are not necessarily independent, and may function at the same time to offer more interactions.

Figure 9:
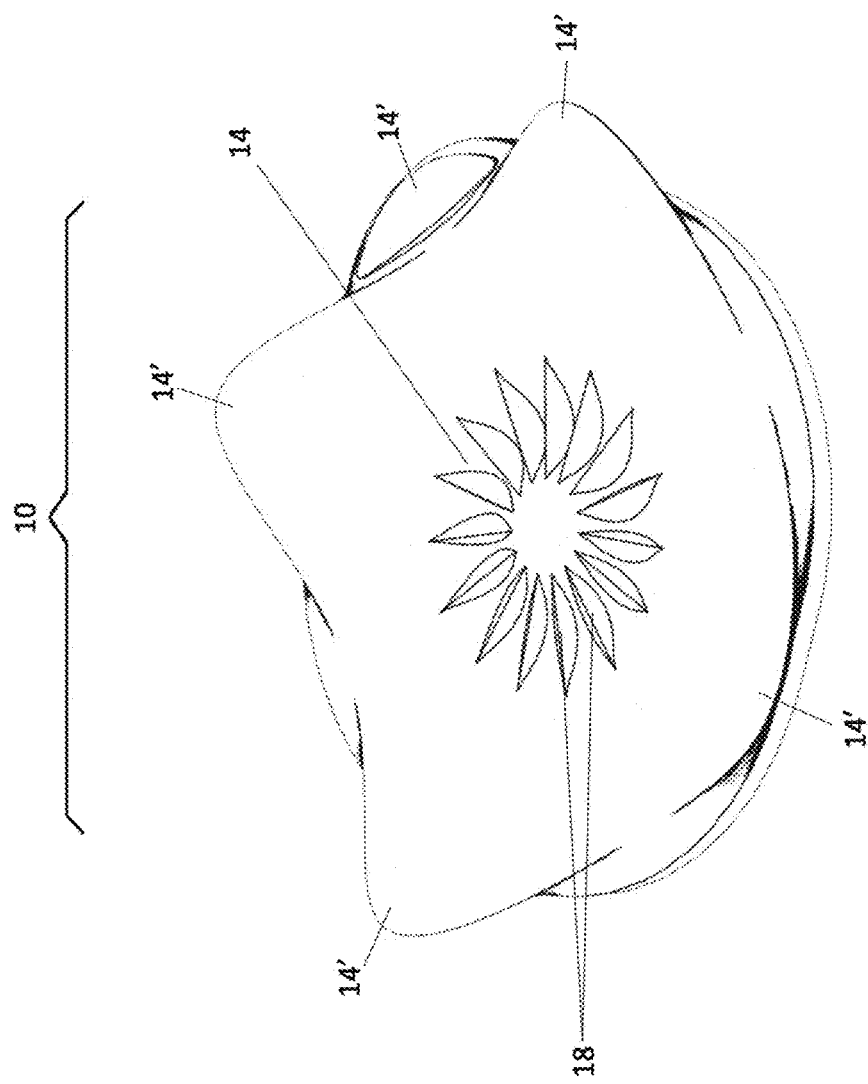

In another embodiment, to include structures of each of these two types, the geometries could be entirely separate. For example, FIG. 9 shows a hybrid structure 10 having an exterior surface comprising a portion of the surface 14 that is textured with a plurality of protrusions 18 in a circular fashion and a portion of the surface 14' that is itself a three-dimensional geometry. In FIG. 9 there is one separate parameter set (set of texture 18, 20) and five separate parameter sets (sets of surface 14').

Figure 10:
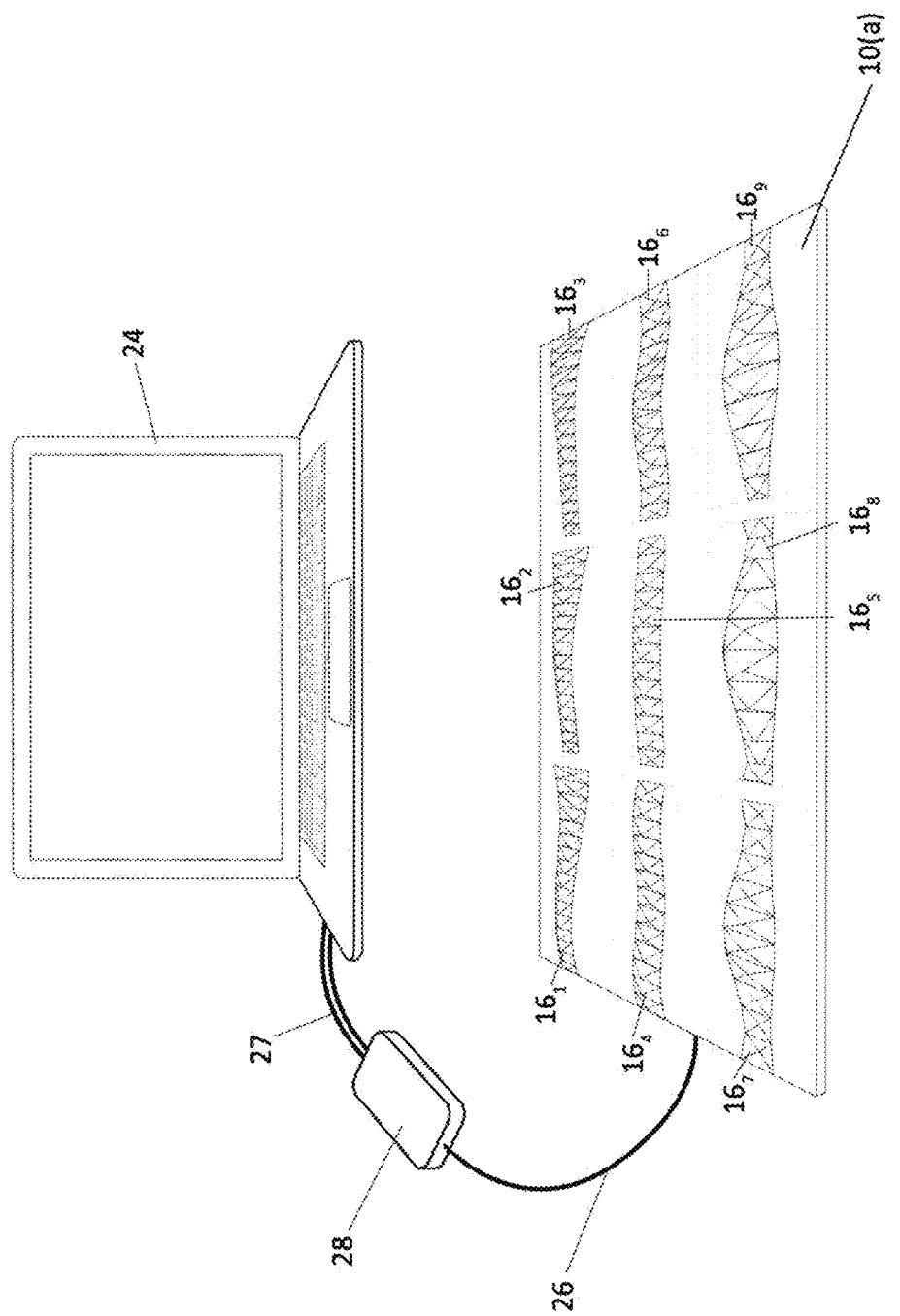
FIG. 10 shows systems incorporating the sensor device according to an embodiment of the present invention.
Figure 10:
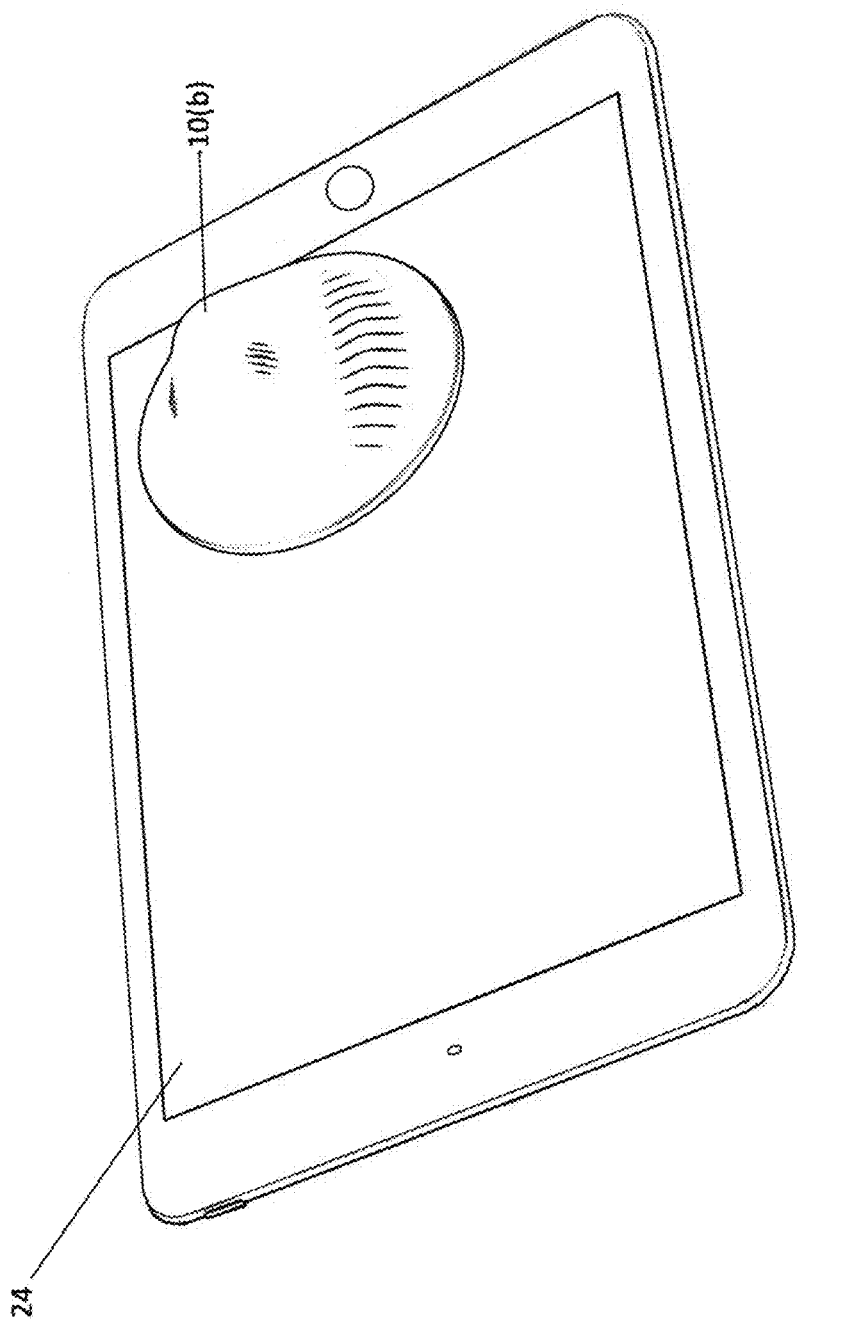

Referring now to FIG. 10(a), the electrically conductive material 10(a) is shown connected to other electrical equipment. Although the material 10(a) shown is the flat sheet/textured surface embodiment of FIG. 1, it will of course be appreciated that any form discussed above or otherwise falling within the scope of the invention could be used instead.

The material 10(a) is connected to a computing or processing device 24 at a sensing location point. The computing or processing device 24 is configured to host instructions for enabling processing of the output signal from the device 10(a). The system 24 includes a processor, a storage device, and a non-transient machine-readable storage medium. The machine-readable storage medium includes instructions which control how the processor receives input data and transforms the input data (the electrical signal) into output data e.g. on the screen, a connected printing device or via an audio output.

The material 10(a) is connected to an intermediary processing device 28 comprising signal processing means provided for converting the output from the material 10(a), via one or more wires or electronic connector(s) 26 e.g. conductive printing. Then, the intermediary device 24 is connected to a computing or processing device 24 via appropriate connection means e.g. the computer's USB port or wireless technology. The wireless technology may be Bluetooth, WiFi, IR, etc.—a simple electrical signal carried on wire(s) 26 to an input signal readable by the computer via the USB port or wireless technology. The output signal is preferably a time varying electrical signal such as a capacitance or voltage reading. In a first or starting state, as shown in FIG. 10(a), the capacitance or voltage reading will be constant. However, when a person touches the material 10(a) e.g. with their finger or a suitable stylus etc., the capacitance or voltage at the point or area of contact on the surface 14 changes, causing a change in the electrical signal output. The computer program may be configured to display the signal and/or information representative of that signal and/or provide an interaction with a software application caused by the signal.

In other cases, now referring to FIG. 10(b), the electrically conductive material 10(b) is shown connected to other electrical equipment through direct physical contact without any wire connection or wireless technologies. The computing or processing device 24 comprises a sensing media e.g. a capacitive touch sensing screen, and signal processing algorithms output from the material 10(b). This embodiment advantageously avoids the use of battery, circuitry and electronical connections. Although the material 10(b) shown is a contoured surface embodiment of FIG. 1, it will of course be appreciated that any form discussed above or otherwise falling within the scope of the invention could be used instead.

FIG. 11(a) represents the base level capacitance signal observed in the starting state of FIG. 10(a). FIG. 11(b) shows how the capacitance increases at a time $t_1$ when a person touches or presses the material 10(a). If a person were to move their finger across the texture in area $16_1$ of the material 10(a), the software would be able to match the observed time varying signal with a pre-stored profile to identify that it is area $16_1$ that is being activated as opposed to any of areas $16_2$ to $16_9$. The software can be programmed to provide a visual indication on the screen to show activation at a virtual location on the screen that mirrors the activation on the physical material 10(a). FIG. 11(c) is a simple depiction of the type of signal variation that could be observed by stroking across one of the material areas $16_1$ to $16_9$. The material 10(a) is pressure sensitive. Pressing harder on the material 10 will result in a larger change in the capacitance signal. The software can be configured to show a larger or more pronounced virtual indication corresponding to that larger output. The material 10(a) can, therefore, be used in a system to provide touch location determination.

In addition, as seen in FIG. 11(c), the number of peaks can be counted when a user's finger (or other conductive device) traverses an area. The relative location, which can also be interpreted as the distance a person's finger has traveled, in one area can also be calculated based on the number. This method can also be used to FIG. 3. Let N represent the total number of peaks within a patterned/textured area spanning a length L, and n represents the number of peaks a figure traverses and comes into contact with within that area. If the pattern is regular, the relative location can be calculated by:

Relative Location=$n/N*L$

FIG. 12 shows a further example capacitance output trace produced as a person moves their finger along the surface of the material 10(a) in the direction shown (right to left, although movement could be in either direction). FIG. 13 shows additional example capacitance output traces for various surface structure geometries. Various radial geometries are shown in the first two columns and linear patterns in the rightmost column. The signals shown are produced by two to three touches on a corresponding texture in one particular direction. As shown in the example flagged "REPEAT", the signal sequences are repeatable on one texture and generally vary in different textures. As the Figure shows the peak time values $P_1$ and $P_2$ are sampled any time the signal switches from decreasing to increasing. The distance between corresponding/repeat output signal features ($P_1$, $P_2$) on the physical surfaces can be used to calculate the speed of movement of a person's finger across the surface:

$$\text{Speed} = \frac{D(P_2, P_1)}{P_2 - P_1}$$

Even subtle changes in the geometry of the textures pattern 16 has been found to generate a different signal. This enables distinguishing between two similar but non-identical patterns 16.

The sensing capability was found to improve when added with a direction sensing aspect, which requires a differentiation calculation. This is the rate of change of the sensing value caused by the change of the contact surface area when an object moves across the textured surface, and is calculated by sampling two close sensing values a and b relative to the time difference between them. The data collection showed that sharper teeth generate a higher capacitance differentiation value. A single unit or peak of the textured surface may be designed to have a progressively decreasing (or increasing) height or have one end of the texture unit being closer to the sensing point than the other, which produces a larger sensing reading. Therefore, comparing a peak value $C(P_2)$ and the previous peak value $C(P1_1)$ may infer the direction of the touch:

$$\text{Direction} = \frac{C(P_2) - C(P_1)}{\text{abs}(C(P_2) - C(P_1))}$$

If $C(P_2)-C(P_1)>0$ then this gives a positive value (1) for the direction; if $C(P_2)-C(P_1)<0$ this gives a negative value (−1) for the direction, i.e. the movement direction is opposite to a direction that gives a positive value. The noise can be minimised by filtering out low absolute difference values.

The advantage of this algorithm is that it can manage real time determination of the touch direction.

There are multiple ways to achieve the touch position detection on the material, for example, by recording and comparing the difference of the first three capacitance differentiation peak values. The trend of the first three values can already generally infer which texture unit 16 is being touched. Another method is to implement a Fourier transform on one complete sequence of signals. (In other words, to deconstruct the time-based capacitance graph into the frequencies of changes that the graph is made up of). This method may have a higher detection resolution of the relative finger position on each texture unit, but it has significant time lag, and therefore is only viable to short textures. Machine learning is also considered for future scenarios.

The above is given as an example only, and other ways (either currently known or to yet be developed) are possible, including machine learning and evolutionary algorithms and artificial intelligence, and these may also be used in embodiments of the invention.

Figure 14A:
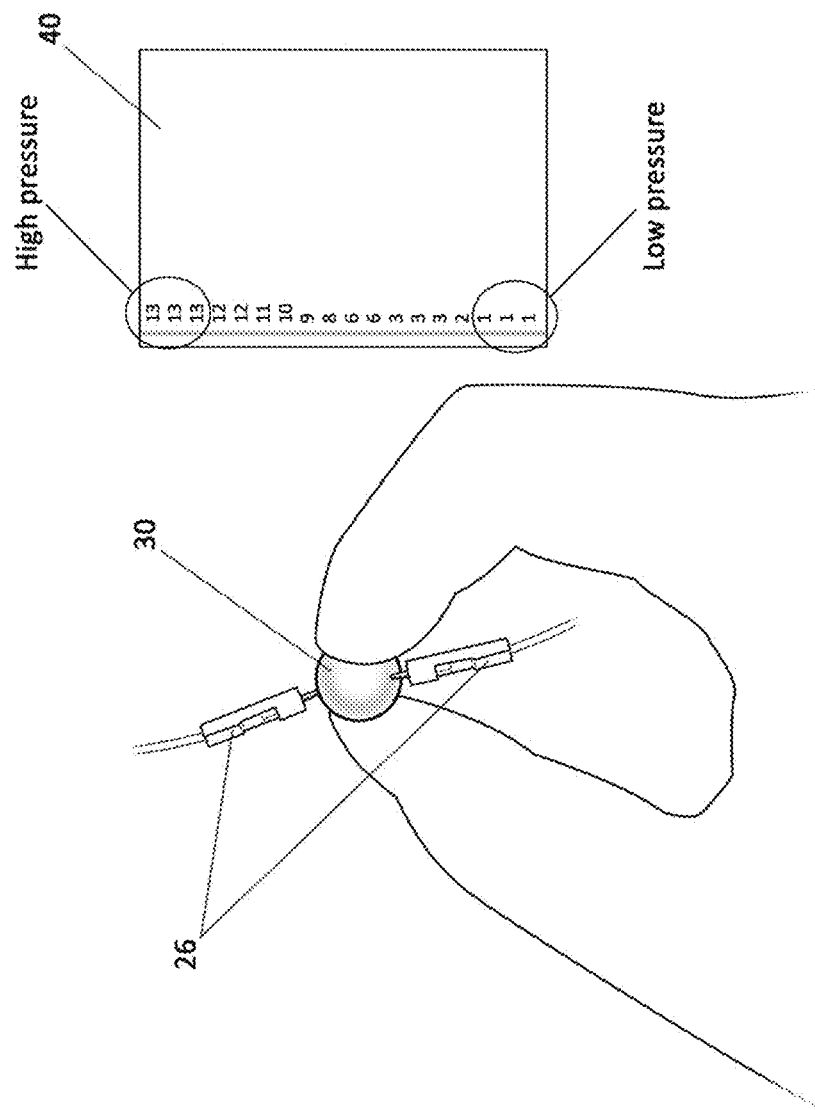
Figure 14B:
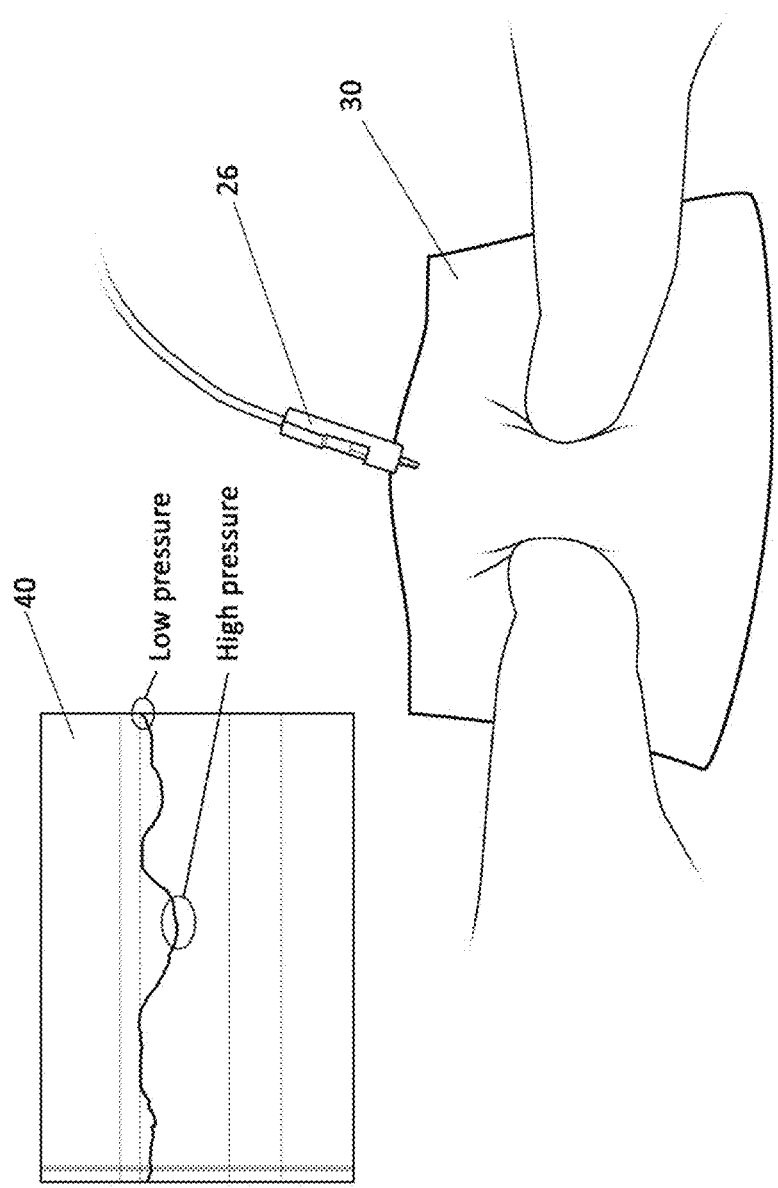
Figure 14C:
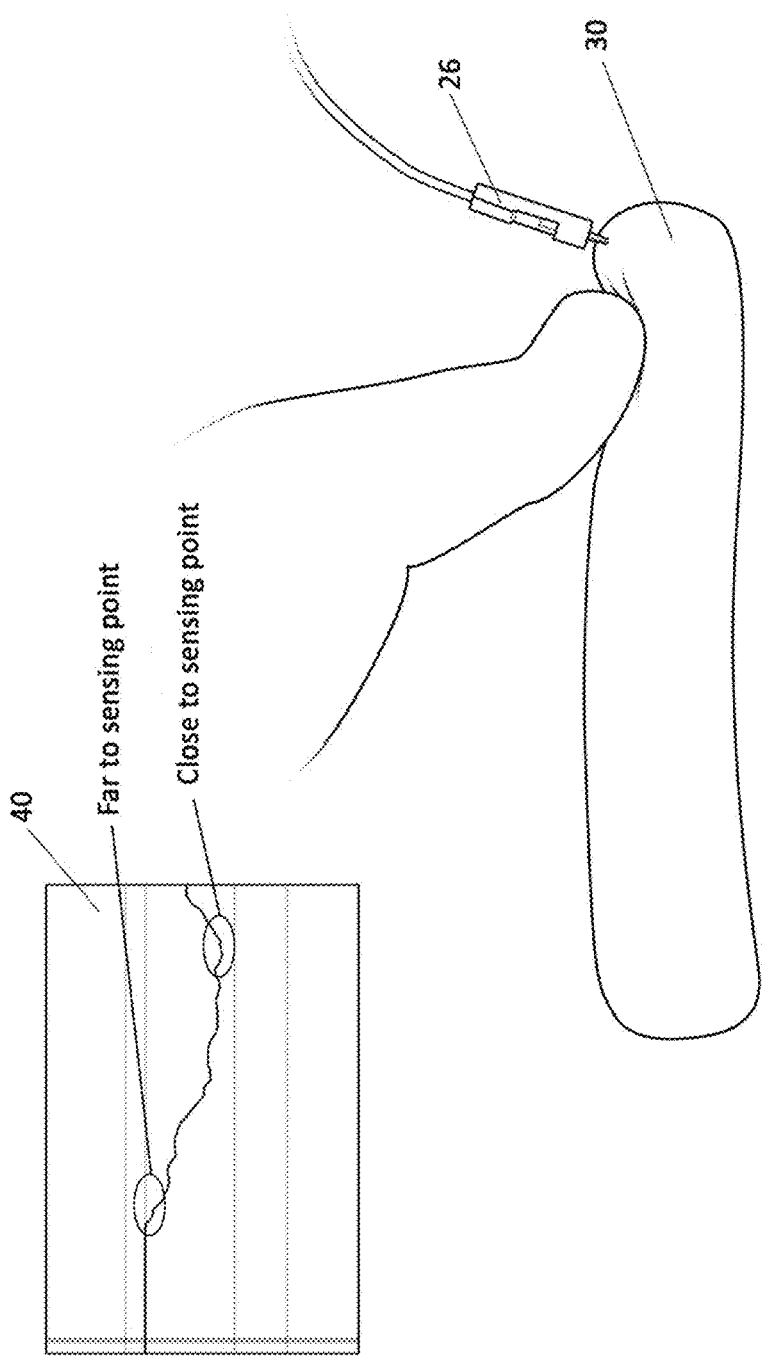

FIGS. 14(a) to (c) show how different touch mechanisms can be employed in embodiments of the invention. In FIG. 14(a), a portion 30 of the material 10 is provided and two-point pressure from opposite sides of the material 10, 30 causes a change in output signal 40. In the embodiment shown there are two output wires 26, which enables the two-point pressure sensing. Here, one wire pulses a small voltage into the sensing point. The other wire receives a voltage. The two together can function as a capacitive sensing mechanism. In FIG. 14(b), the provision of a single contact 26 attached to the material 10 provides for single point pressure sensing 40. In FIG. 14(c) the arrangement enables single point distance sensing 40. Generally speaking, the closer the touch point is to the sensing point (i.e. where the wire connects to the surface), the larger the value.

FIGS. 12 and 14 in particular illustrate different movements and interactions with the material 10. Generally speaking, interactions with the textured/patterned portions of the material 10 involve movement across the texture/pattern (e.g. as shown in FIG. 12) and interactions with the larger 3D parts of the material involve applying a force or pressure (e.g. as shown in FIGS. 14a-c. Of course, the textured parts of the material could also be responsive to force or pressure, and/or the larger 3D parts of the material could be responsive to movement across the surface thereof. The principal mechanisms are, however, the former.

Figure 15A:
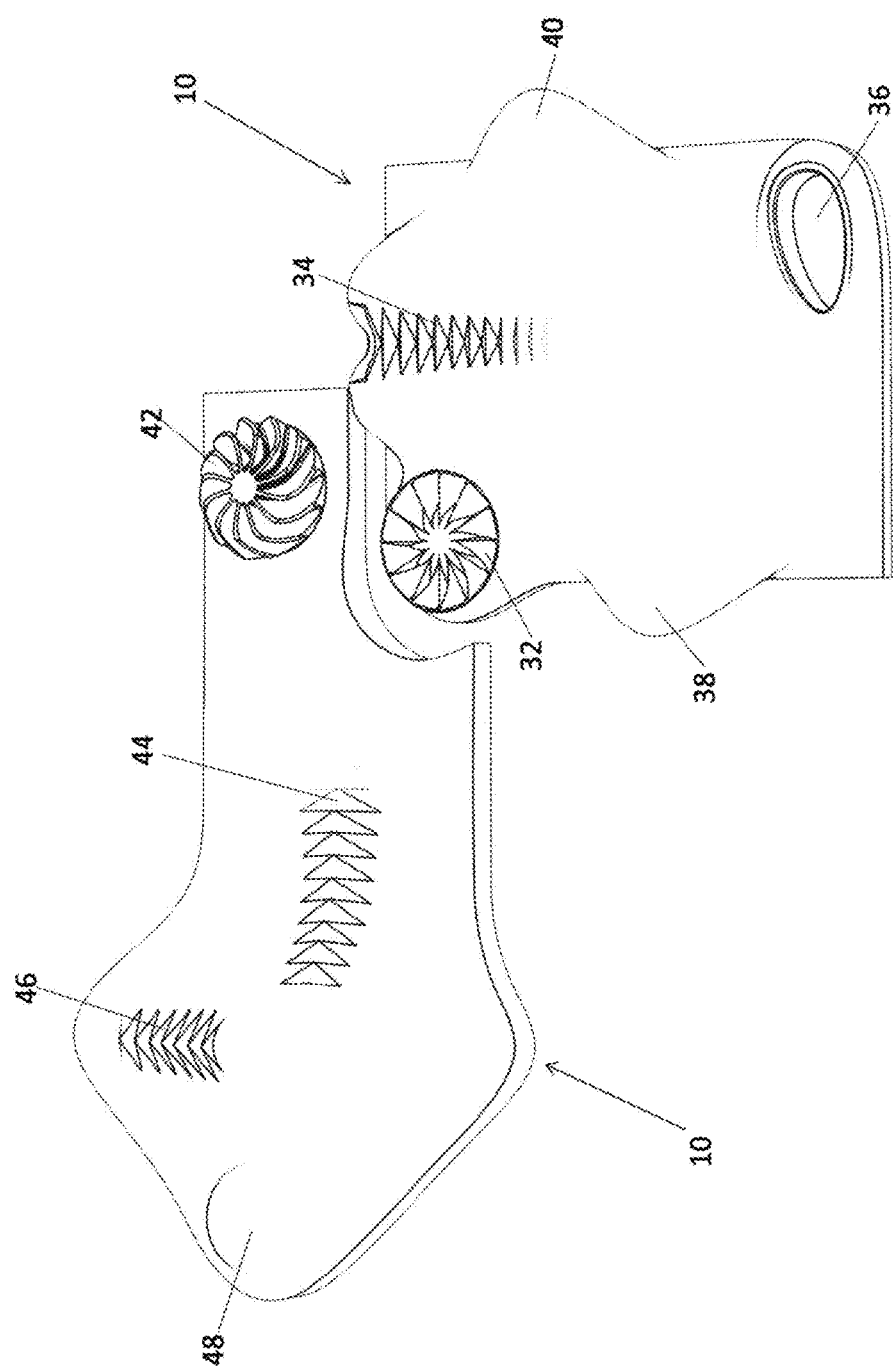
Figure 15B:
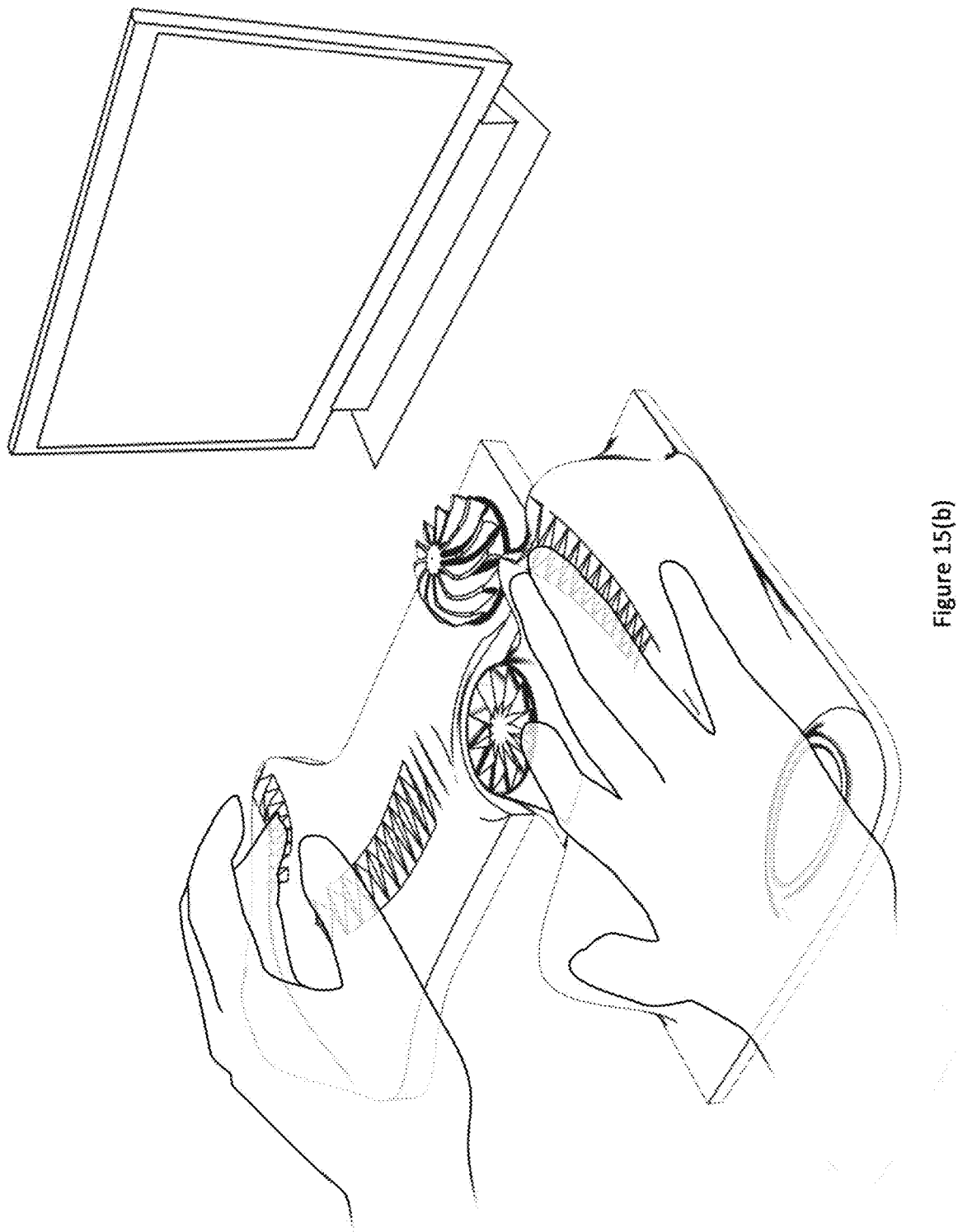

Embodiments of the invention have various practical applications. For example, the invention could be employed in a vehicle, e.g. to provide control of a sound system window/door opening/closing, temperature and environment etc. FIGS. 15(a) and (b) show how the invention could be utilised as a CAD modelling control tool. These figures show a right-handed "navigation" element 10 integrating two texture units, in accordance with embodiments of the invention. The material 10 could be configured with a radial control 32 providing a point selection control function and/or a linear control 34 providing a vertical rotate control function. The device/battery may be activated and/or deactivated with a pressure switch 36. Pan or horizontal rotation control functionality may be provided by controls 38, 40. The left hand "shape" element 10 comprises a render dial 42, first and second pull elements 44, 46 and a generative shape control 48.

Figure 16:
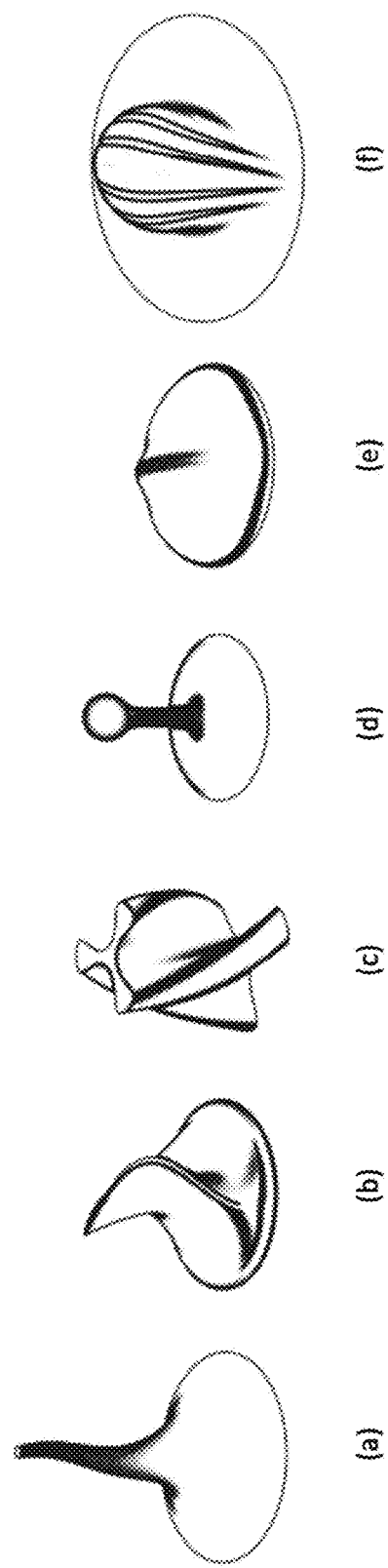

A device incorporating the elements of FIG. 16 can be used in sound generation where, in testing, six different modules were used to control pitch, volume, surround sound, base, noise and granular effect (as shown in FIGS. 16(a)-(f) respectively). It will be appreciated that other sound effects and ways of controlling these can also be provided in accordance with embodiments of the invention. In testing, each module aimed at facilitating a specific tactile interaction and creating a vivid visual hint to the effect output e.g. displayed on the screen of a computing device. Here, pitch control (FIG. 16(a)) is achieved with a vertically oriented device that produces signals through gradually decreasing contact when stroked upwards. Surround sound (FIG. 16(b)) can be achieved through a panning controller having an asymmetric 2-axis propeller shape that suggests a twist motion. FIG. 16(c) shows an asymmetric 3-axis propeller shape material that can be used as a granular effect controller, again promoting a twist motion. In FIG. 16(d), a noise generator device is shown being vertically oriented with a mass on top, operable to generate noise signals when flipped on top. A main track volume control is shown in FIG. 16(e), providing a soft button shape effective for providing volume control when pressed In FIG. 16(f), a base track controller is shown, being of oval shape with four gap lines on the top surface, producing two states of stable signals when the gaps are closed. Other uses include CAD, digital productions, and gaming/interface products.

Figure 17:
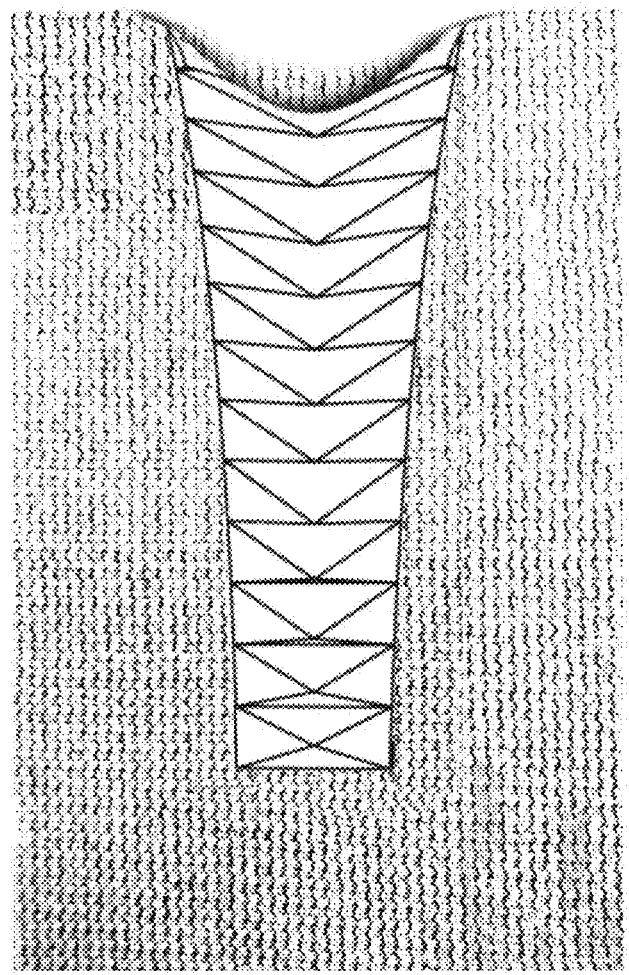

FIG. 17 gives a further example of use of the material 10 provided on a piece of fabric to demonstrate the use of the device in a wearable.

Figure 18:
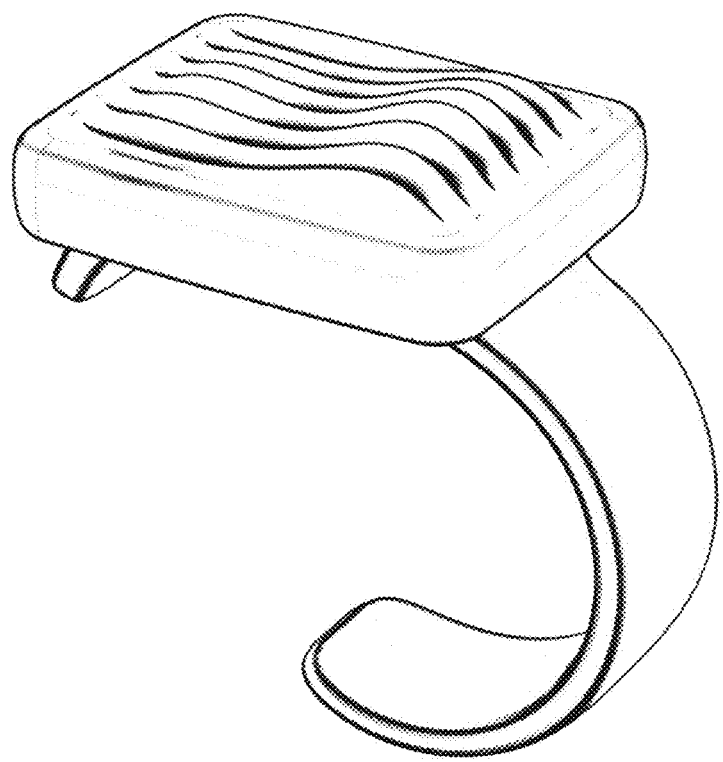

FIG. 18 gives a further example of the material 10 to demonstrate the use of the device as a wearable controller.

Figure 19:
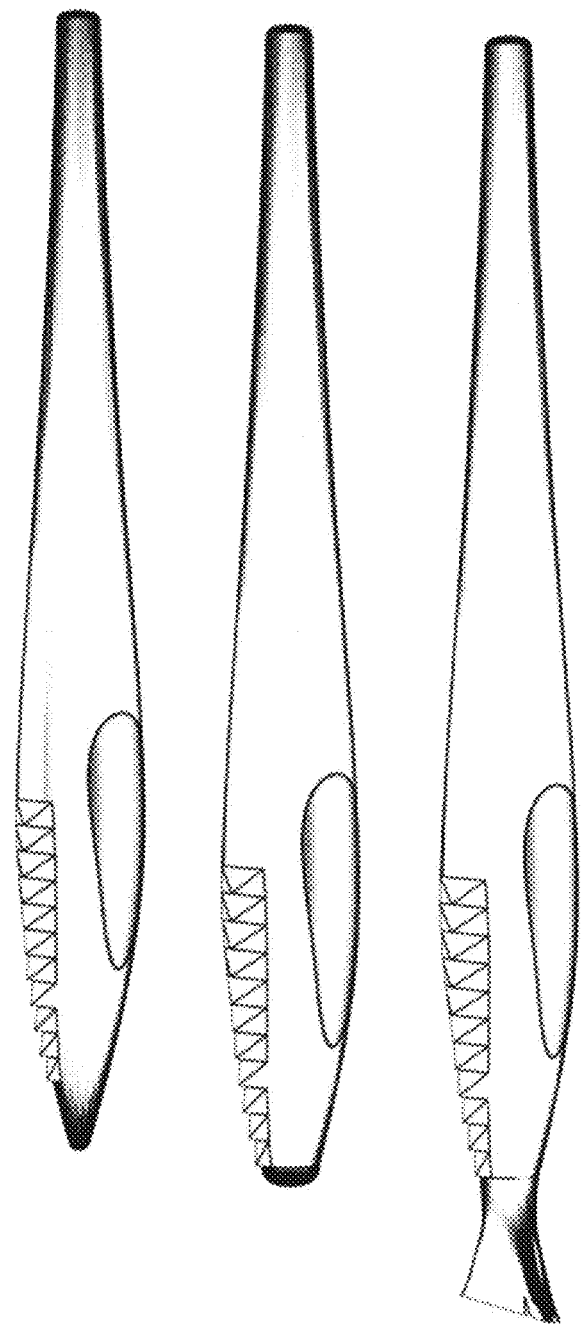

FIG. 19 gives a further example of the material 10 to demonstrate the use of the device as a series of smart styluses that have control functions embedded.

Embodiments of the present invention, e.g. as used in a vehicle advantageously avoid the need for distracting visual indicia. Instead, the form and structure of the material 10 is itself suggestive and indicative of the method of use, avoiding the need for distracting visual markings etc.

From reading the present disclosure, other variations and modifications will be apparent to the skilled person. Such variations and modifications may involve equivalent and other features which are already known in the art of wireless communication, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and any reference signs in the claims shall not be construed as limiting the scope of the claims.

The invention claimed is:

1. A sensor device, the device comprising:
   a unitary piece of electrically conductive material configured to exhibit a change in at least one of a voltage and a capacitance in response to at least one of a contact and a proximity with a conductive object, the electrically conductive material having:
      a measurement sensing point thereon for measuring the at least one of the voltage and the capacitance of the electrically conductive material; and
      at least in part, a three-dimensionally profiled surface for receiving at least one of a contact and a proximity with the conductive object, the three-dimensionally profiled surface configured to create at least:
         a first change in the at least one of the voltage and the capacitance measured at the measurement sensing point in response to the at least one of the contact and the proximity with the conductive object being at a first position on the three-dimensionally profiled surface relative to the measurement sensing point, and
         a second change in the at least one of the voltage and the capacitance measured at the measurement sensing point in response to at the least one of the contact and the proximity with the conductive object being at a second position on the three-dimensionally profiled surface relative to the measurement sensing point, wherein the first and second positions are both different from each other and also from the measurement sensing point, and wherein the first change is different from the second change; and
   wherein the device is configured to detect at least one of a contact position, a speed of movement, and a direction of movement of the conductive object between the first and second positions on the three-dimensionally profiled surface of the electrically conductive material relative to the measurement sensing point based on at least one of the first and second changes in the at least one of the voltage and the capacitance measured at the measurement sensing point.

2. The sensor device of claim 1, wherein the three-dimensionally profiled surface is textured, and wherein the texture is configured so as to provide the first and second changes in the at least one of the voltage and the capacitance.

3. The sensor device of claim 1, wherein the three-dimensionally profiled surface is textured with a regular or irregular geometric pattern, and wherein the texture is configured so as to provide the first and second changes v in at least one of the voltage and the capacitance.

4. The sensor device of claim 3, wherein the geometric pattern is formed by a variation in elevation or depression across the three-dimensionally profiled surface of the electrically conductive material.

5. The sensor device of claim 4, wherein the geometric pattern comprises a plurality of discontinuities or undulations.

6. The sensor device of claim 5, wherein the geometric pattern comprises a plurality of peaks and troughs across the three-dimensionally profiled surface in a pattern.

7. The sensor device of claim 3, wherein the geometrical pattern is substantially a repeating waveform.

8. The sensor device of claim 3, wherein the geometric pattern is configured so as to provide a change in the at least one of the voltage and the capacitance when subjected to a movement of the conductive object between the first and second positions in a direction across the pattern.

9. The sensor device of claim 1, wherein the electrically conductive material further has, at least in part, a three-dimensional form in addition to the three-dimensionally profiled surface.

10. The sensor device of claim 9, wherein the electrically conductive material is also configured to exhibit a change in the at least one of the voltage and the capacitance in response to pressure or force thereon.

11. The sensor device of claim 10, wherein pressure on or contact with the three-dimensional form causes a change in the at least one of the voltage and the capacitance measured at the measurement sensing point.

12. The sensor device of claim 1, wherein the electrically conductive material comprises a pliable electrically conductive material.

13. The sensor device of claim 1, wherein the electrically conductive material comprises a rigid electrically conductive material.

14. The sensor device of claim 1, wherein the device comprises:
   (i) a conductive layer or a conductive coating; or
   (ii) a flexible or fabric layer having a conductive coating; or
   (iii) a non-conductive insulation layer provided on the electrically conductive material.

15. A method of sensing an electrical signal, the method comprising:
   providing a unitary piece of electrically conductive material configured to exhibit a change in at least one of a voltage and a capacitance in response to at least one of a contact and a proximity with a conductive object, the electrically conductive material having:
      a measurement sensing point thereon for measuring the at least one of the voltage and the capacitance of the electrically conductive material, and
      at least in part, a three-dimensionally profiled surface for receiving at least one of a contact and a proximity with the conductive object, the three-dimensionally profiled surface configured to create:
         a first change in the at least one of the voltage and the capacitance measured at the measurement sensing point in response to the at least one of the contact and the proximity with the conductive object being at a first position on the three-dimensionally profiled surface relative to the measurement sensing point; and
         a second change in the at least one of the voltage and the capacitance measured at the measurement sensing point in response to the at least one of the contact and the proximity with the conductive object being at a second position on the three-dimensionally profiled surface relative to the measurement sensing point, wherein the first and second positions are both different from each other and also from the measurement sensing point, and wherein the first change is different from the second change; and
   detecting at least one of a contact position, a speed of movement, and a direction of movement of the conductive object between the first and second positions on the three-dimensionally profiled surface of the electrically conductive material relative to the measurement sensing point based on at least one of the first and second changes in the at least one of the voltage or capacitance measured at the measurement sensing point.

16. The method of claim 15, further comprising configuring the electrically conductive material, at least in part, with a three-dimensional form such that pressure or contact therewith creates a change in the at least one of the voltage and the capacitance detectable by an electrical signal output device.

17. The method of claim 15, wherein the three-dimensionally profiled surface is textured with a geometric pattern that is configured such that movement of the conductive object between the first and second positons in a direction across the pattern causes a change in the at least one of the voltage and the capacitance measured at the measurement sensing point.

18. A non-transitory computer readable medium comprising a computer program configured to, when executed, cause a computing device to perform the method according to claim 15 and,
   further configured to, when executed, cause the computing device to detect at least one of a touch pressure and proximity relative to the measurement sensing point by processing the electrical signal.

* * * * *